United States Patent
Andeen et al.

(10) Patent No.: US 6,355,994 B1
(45) Date of Patent: Mar. 12, 2002

(54) PRECISION STAGE

(75) Inventors: Gerry B. Andeen, Menlo Park; Martin E. Lee, Saratoga, both of CA (US)

(73) Assignees: Multibeam Systems, Inc., Santa Clara, CA (US); Motorola Inc., Schaumburg, IL (US)

( * ) Notice: Subject to any disclaimer, the term of this patent is extended or adjusted under 35 U.S.C. 154(b) by 0 days.

(21) Appl. No.: 09/543,265

(22) Filed: Apr. 5, 2000

Related U.S. Application Data

(60) Provisional application No. 60/163,846, filed on Nov. 5, 1999.

(51) Int. Cl.[7] .............................................. H02K 33/00
(52) U.S. Cl. ........................ 310/15; 310/12; 310/90.5; 248/550; 248/638
(58) Field of Search ........................... 310/15, 51, 12, 310/90.5, 17; 248/550, 619, 638

(56) References Cited

U.S. PATENT DOCUMENTS

| | | | |
|---|---|---|---|
| 4,019,109 A | 4/1977 | McCoy et al. | 318/640 |
| 4,485,339 A | 11/1984 | Trost | 318/640 |
| 4,506,204 A | 3/1985 | Galburt | 318/653 |
| 4,506,205 A | 3/1985 | Trost et al. | 318/653 |
| 4,507,597 A | 3/1985 | Trost | 318/615 |
| 4,516,253 A | 5/1985 | Novak | 378/34 |
| 4,694,477 A | 9/1987 | Siddall | 250/492.2 X |
| 4,952,858 A | 8/1990 | Galburt | 318/567 |
| 5,140,242 A | 8/1992 | Doran et al. | 318/640 |
| 5,178,357 A | 1/1993 | Platus | 248/619 |
| 5,310,157 A | 5/1994 | Platus | 248/619 |
| 5,327,060 A | 7/1994 | Van Engelen et al. | 318/640 |
| 5,345,206 A | 9/1994 | Morcos | 335/222 |
| 5,370,352 A | 12/1994 | Platus | 248/619 |
| 5,390,892 A | 2/1995 | Platus | 266/217 |
| 5,528,118 A | 6/1996 | Lee | 318/38 |
| 5,549,270 A | 8/1996 | Platus et al. | 248/619 |
| 5,631,506 A | 5/1997 | Paden | 310/51 |
| 5,669,594 A | 9/1997 | Platus et al. | 248/619 |
| 5,693,990 A | * 12/1997 | Miyazaki | 310/15 |
| 5,744,924 A | 4/1998 | Lee | 318/38 |
| 5,794,909 A | 8/1998 | Platus et al. | 248/620 |
| 5,806,193 A | 9/1998 | Ebihara | 33/1 M |
| 5,833,204 A | 11/1998 | Platus et al. | 248/619 |
| 6,021,991 A | * 2/2000 | Mayama et al. | 248/550 |

OTHER PUBLICATIONS

Slocum, "Precision Machine Design", 1992, pp. 521–538, Prentice Hall, NJ, USA month unknown.

* cited by examiner

*Primary Examiner*—Nestor Ramirez
*Assistant Examiner*—Judson H. Jones
(74) *Attorney, Agent, or Firm*—John M. Macaulay

(57) ABSTRACT

An ultra-high precision stage incorporating a novel, legged design suitable for applications requiring high voltage and vacuum is disclosed herein. The stage comprises: a base; a frame attached to the base; a platform with a bottom platform surface; at least three adjustable limbs coupled to the base and the bottom platform surface, each limb comprising a raising member attached to the base, a first attachment member attached to the raising member, a leg, a bottom end of the leg attached to the first attachment member, a second attachment member attached to a top end of the leg and the second attachment member attached to the bottom platform surface; and platform movement members coupled to the platform and the frame, providing precise positioning and movement of the platform. The attachment members can be flexure joints; further, they can be flexural thrust joints. The platform can have six degrees of freedom of movement and accommodate wafers with diameters of 300 mm. The stage can weigh less than 100 lbs.

37 Claims, 24 Drawing Sheets

SECTION X-X

PRECISION STAGE

CROSS-REFERENCE TO RELATED APPLICATIONS

This application claims the benefit of U.S. Provisional Application No. 60/163,846 filed Nov. 5, 1999. This application is related to co-pending U.S. patent application entitled "Flexural Joint" by Martin E. Lee, filed on the same day as the present application.

BACKGROUND OF THE INVENTION

1. Field of the Invention

This invention relates to the field of precision stages, and in particular to stages compatible with high voltage and high vacuum, for use in multi-column charged particle lithography, test and inspection systems.

2. Description of the Related Art

Precision stages find many applications with steadily increasing precision requirements. In semiconductor capital equipment, for example, precision stages are required for carrying wafers during lithography process steps. As the length scales of microcircuit features become smaller, modern lithography moves toward the use of higher resolution techniques, for example phase shift masks, extreme ultraviolet (EUV) systems, and high throughput charged particle beam lithography. With the overall trend toward smaller features, positioning requirements of the wafer (and a stage platform upon which it rests) relative to lithography optics have become increasingly stringent.

Due to the comparative magnitudes of charged particle wavelengths and sub-micron features, charged particle (especially electron) beam lithography is an important technique for realizing sub-micron feature sizes. However, in charged particle beam lithography systems, vacuum and high voltage compatibility is an inherent design complication.

In order to accelerate a charged particle beam, for example an electron beam, particle beam lithography systems typically have electric potential differences (up to 100 kV) between different components. In many designs, a workpiece or wafer is held at a potential close to electrical ground and the electron source is at comparatively higher voltage. However, in some systems, the electron source is operated at a potential close to electrical ground, while the workpiece is held at comparatively higher voltage. Such an electron source is described in U.S. Pat. No. 5,637,951.

A vacuum is also required within the lithography device to allow the propagation of an electron beam. A high vacuum, with pressure of no more than $10^{-6}$ Torr, is typically required. Thus, in addition to providing the required precision, a stage for electron beam lithography must be able to sustain high voltage differences between components and be suitable for operation under high vacuum conditions.

In regard to high voltage operability, many prior art precision stages comprise several closely coupled kinematic platforms. An exemplary prior art device of this type is shown in FIG. 1. However, in a system where up to 100 kV potential difference must be held off with no arcing or other undesirable effects, close mechanical coupling of non-insulating components, such as illustrated in FIG. 1, would be inappropriate.

In regard to vacuum compatibility, many prior art stages are inappropriate for use in a high vacuum due to bearing designs that are prone to out-gassing, generating particulates, or otherwise contaminating the vacuum system.

In comparison to other bearing types, flexural bearings are very well-suited for use in vacuum, and allow smooth, precise, predictable motion of the stage. Such properties are discussed in detail by Alexander Slocum, "Precision Machine Design", Prentice Hall, N.J., 1992. However, most prior art flexural bearings are potentially unstable when used as thrust bearings since the flexural joint is prone to distortion or buckling under compressive loads. Thus, in precision stage applications requiring vacuum compatibility, there is a need for multiple degrees of freedom of movement flexural thrust joints.

Further, for positioning systems requiring precision movement and short times to reach a steady-state position (settling times) after each movement, attention must be paid to perturbations that are insignificant for less precise systems. In order to optimize the mechanical stability of the stage under external impulses, vibrations or other mechanical perturbations, most prior art high precision lithography stages utilize massive, high inertia elements. However, while a high inertia system tends to be mechanically stable, the reaction forces associated with moving a massive stage can degrade the accuracy and precision of the relative positioning of the lithography optics and the work platform, unless a long settling time is accepted. A combination of careful isolation of the optics and addition of considerable mass to the optics mounts is required to overcome this problem. The resulting weight and volume of such devices is undesirable. It would be beneficial, then, to have a comparatively low-mass high precision stage that avoids these problems. Furthermore, such a low-mass stage would be well-suited for commercial lithography tools with their high throughput requirements, where frequent large accelerations and decelerations are required for rapid processing of the workpiece.

Therefore, especially for use in charged particle lithography systems, there is a need for stages capable of maintaining high precision alignment with a reference (for example the position of the lithography optics) while being vacuum compatible and capable of sustaining large voltage differences between elements. Such platforms should be continuously and smoothly movable over six degrees of freedom of movement. Such platforms should also be capable of holding workpieces with characteristic lengths of hundreds of millimeters, e.g. 300 mm silicon wafers.

SUMMARY OF THE INVENTION

This invention includes a precision stage incorporating a novel, legged design. The stage may be used in applications requiring high voltage and vacuum, such as charged particle lithography. According to aspects of the invention, the stage comprises: a base; a frame attached to the base; a platform with a bottom platform surface; at least three adjustable limbs coupled to the base and the bottom platform surface, each limb comprising a raising member attached to the base, a first attachment member attached to the raising member, a leg, a bottom end of the leg attached to the first attachment member, a second attachment member attached to a top end of the leg and the second attachment member attached to the bottom platform surface; and platform movement members coupled to the platform and the frame. The attachment members can have two or three degrees of freedom of movement; they can be flexure joints; they can be flexural thrust joints. Furthermore, the first and second attachment members can be distinct from each other, by the degrees of freedom or the type of joint. The platform movement members can be actuators, and at least three actuators are provided for the platform. Further, they can be electromagnetic platform actuators, comprising: a first coil attached to the platform; a first magnet assembly attached to the frame and electromagnetically coupled to the first coil; and, a current control system electrically coupled to the first coil. Furthermore, a cooling system and cooling channels can be thermally coupled to the component of the electromagnetic actuator attached to the platform, allowing for platform temperature control to within +/−0.1 degrees C. The raising members can be a combination of elements, arranged in parallel, chosen from: support elements, which provide a force to oppose the weight of the platform; raising actuators, which allow adjustment of the elevation of the platform relative to the base; and damping elements. The support elements can be constant force supports, and the constant force supports can be buckled columns. The raising actuators can be electromagnetic raising actuators, comprising: a second coil attached to the base; a second magnet assembly attached to one of the first attachment members and electromagnetically coupled to the second coil; and, a current controller coupled to the second coil.

In preferred embodiments: the platform has six degrees of freedom of movement; the legs are substantially parallel to each other; the platform is capable of accommodating wafers with a diameter of at least 100 mm; the platform and/or legs are made of substantially electrically insulating material, and/or the frame is a vacuum chamber, such that a workpiece can be held at up to 75 kV potential relative to the base and frame. The embodiment of the stage capable of accommodating a 300 mm wafer can weigh less than 100 lbs.

In a preferred embodiment, the stage comprises: a base; a frame attached to the base; a platform with a bottom platform surface; three substantially parallel adjustable limbs coupled to the base and the bottom platform surface, each limb comprising a raising member attached to the base, where the raising member is a constant force support in parallel with an electromagnetic raising actuator, a first flexural thrust joint with three degrees of freedom of movement attached to the raising member, a leg, a bottom end of the leg attached to the first flexural thrust joint, a second flexural thrust joint with two degrees of freedom of movement attached to a top end of the leg and the second flexural thrust joint attached to the bottom platform surface; and four electromagnetic platform actuators coupled to the platform and the frame, whereby coordinated operation of both raising actuators and platform actuators provides precise positioning and movement of the platform with six degrees of freedom.

DETAILED DESCRIPTION

Figure 1:
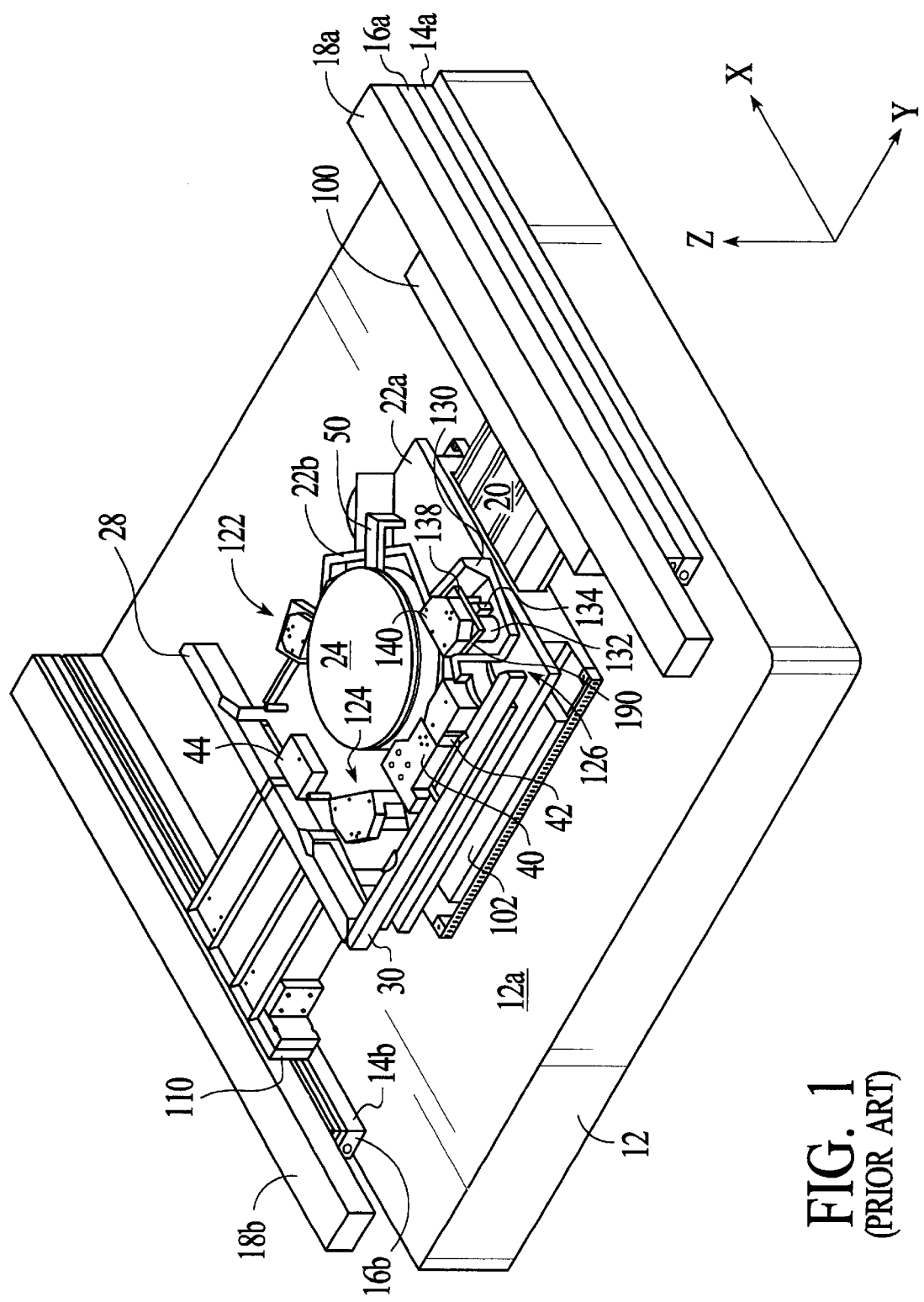
FIG. 1 shows a prior art stage.
Figure 2A:
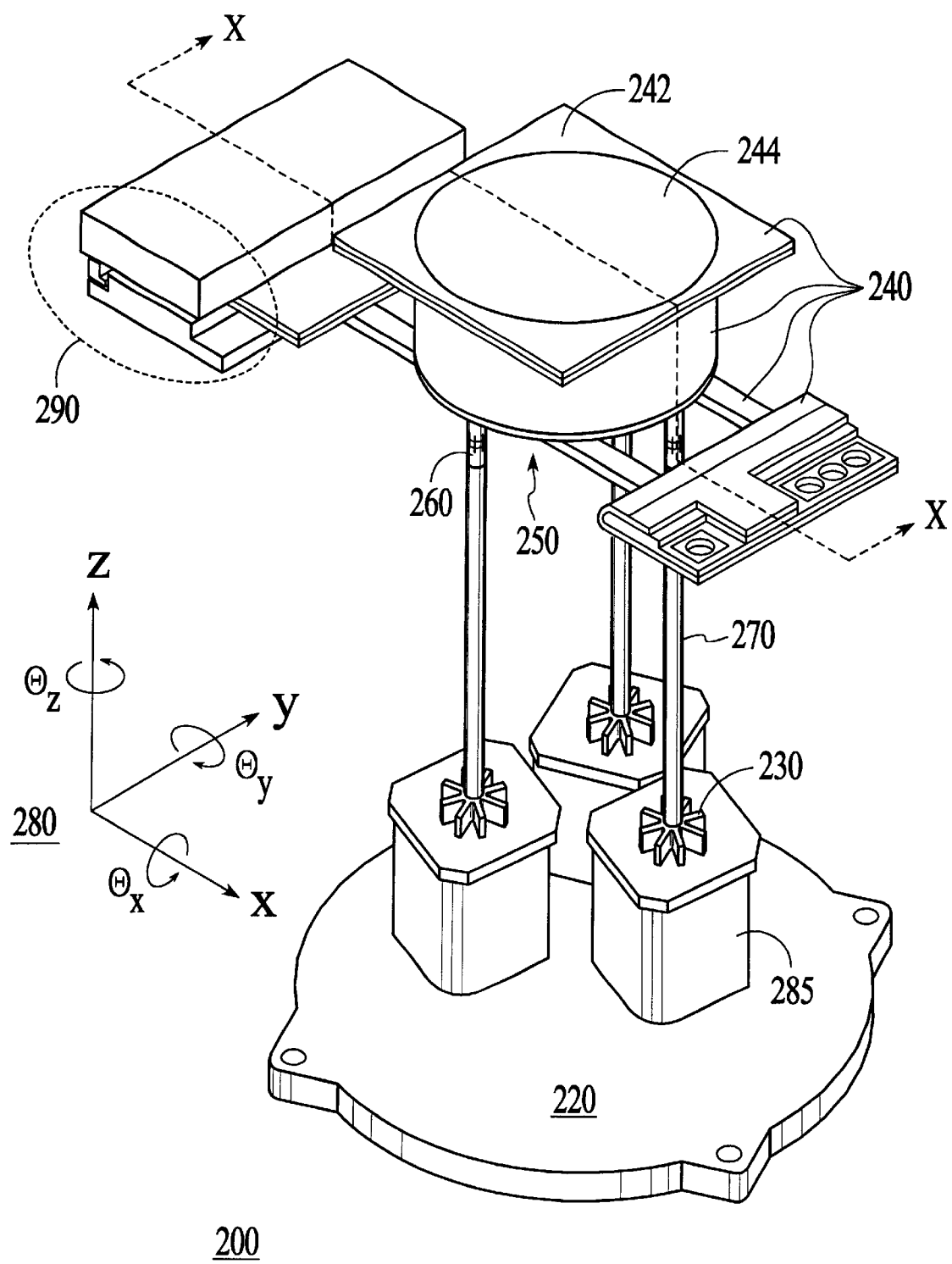
FIG. 2A shows a preferred embodiment of the leg stage.
Figure 2B:
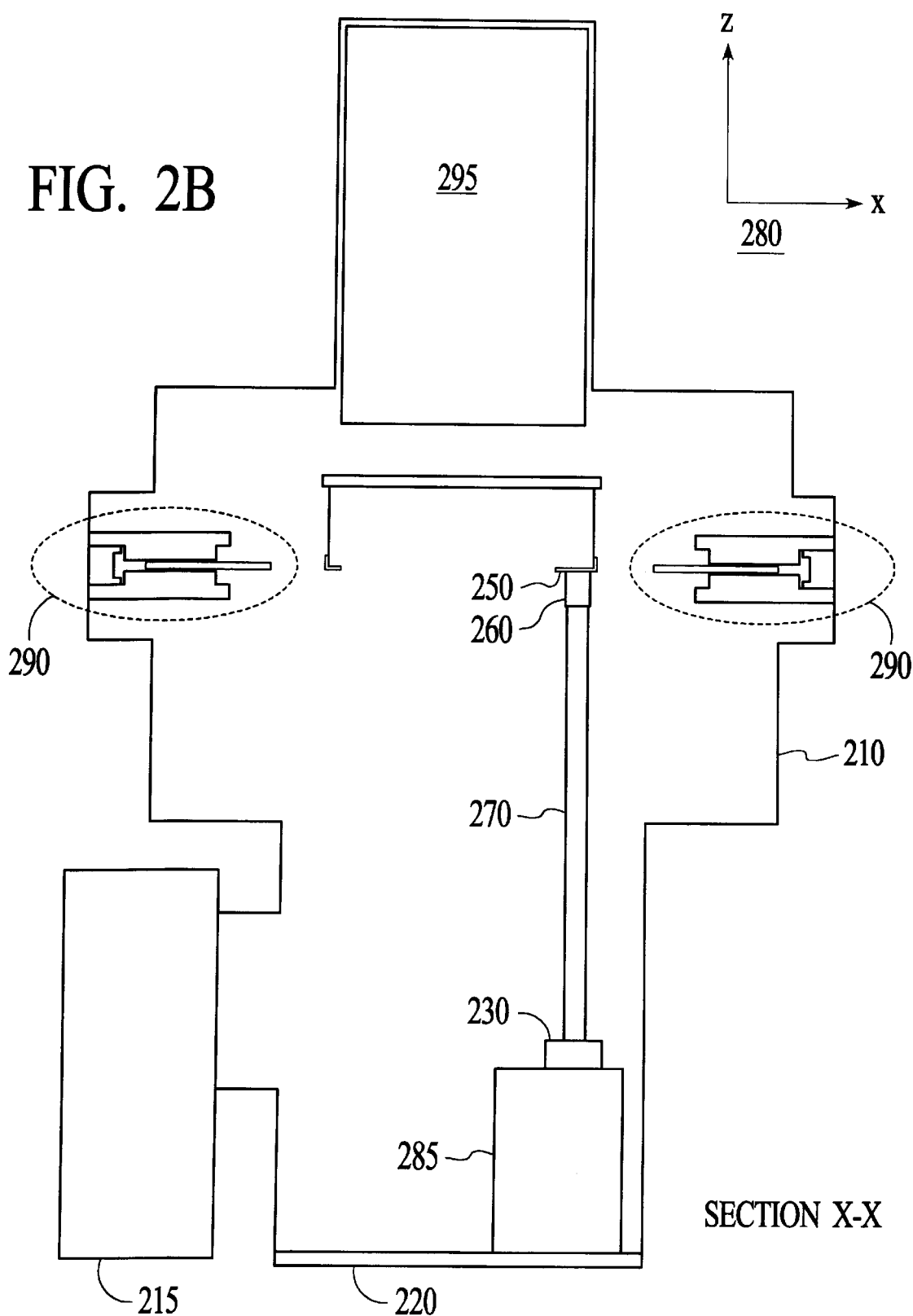
FIG. 2B shows a cross-section through the leg stage of FIG. 2A, in the vertical plane containing X–X', and also shows a second platform movement member, a vacuum chamber, and charged particle optics.
Figure 2C:
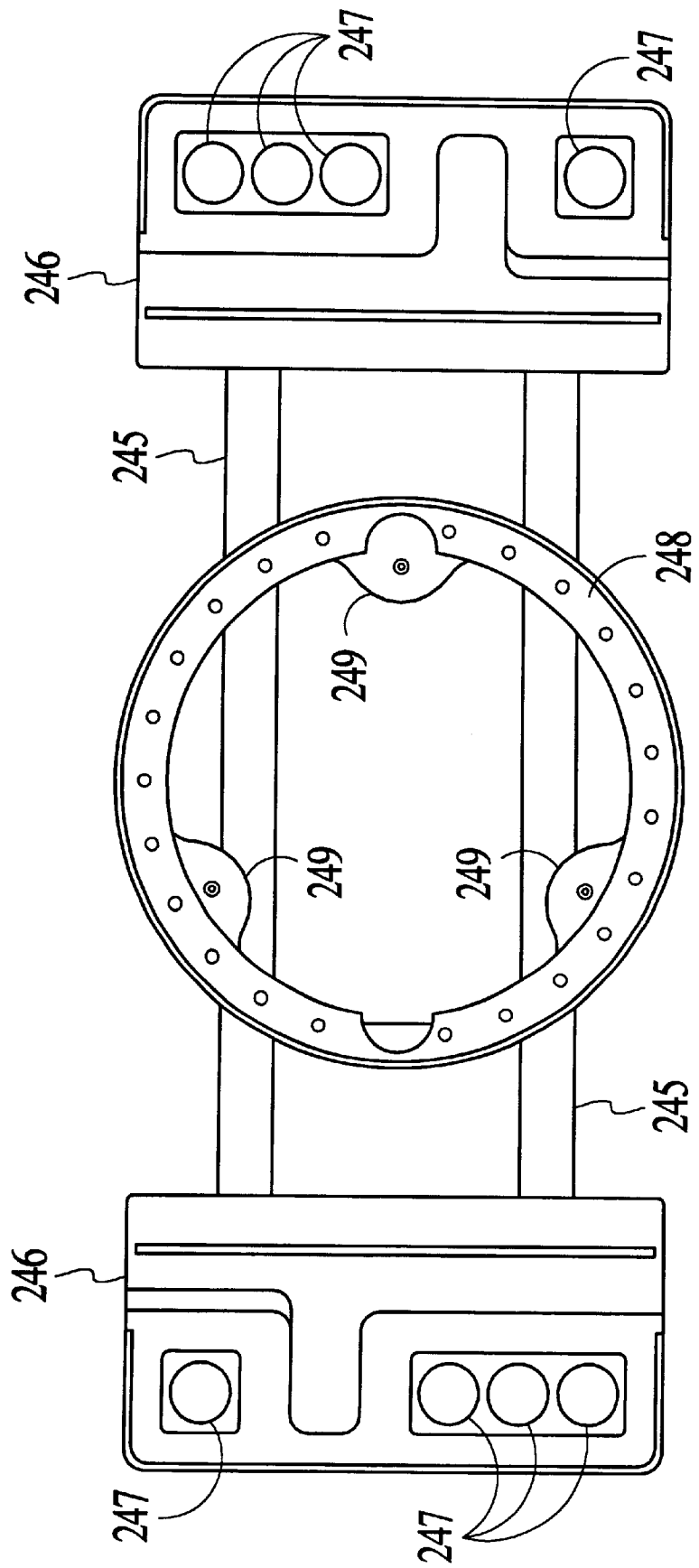
FIG. 2C shows a plan view of the platform, with wafer and wafer chuck removed.

FIG. 2A shows a perspective of a preferred embodiment of this invention; various components are not shown, for ease of illustration. In FIG. 2A, stage 200, base 220, first attachment members 230, platform 240, wafer chuck 242, wafer 244, bottom platform surface 250, second attachment members 260, legs 270, platform axes 280, raising members 285, and platform movement members 290 are shown. FIG. 2B shows a cross-section through the leg stage. In FIG. 2B, frame 210 (shown here as a vacuum chamber), vacuum pump 215, base 220, first attachment members 230, second attachment members 260, legs 270, platform axes 280, raising members 285, platform movement members 290, and charged particle optics 295 are shown. FIG. 2C shows the platform with wafer and wafer chuck removed. In FIG. 2C, platform beams 245, platform actuator carriers 246, carrier holes 247, wafer chuck support 248 and leg brackets 249 are shown.

In the embodiment shown in FIG. 2A, first attachment members 230 are coupled to raising members 285 and to the bottom ends of legs 270. The raising members are coupled to the base 220. The legs support platform 240 and the top ends of legs 270 are coupled to bottom platform surface 250 by second attachment members 260. Platform movement member 290 is coupled to the platform. In preferred embodiments the legs are substantially parallel to each other.

In FIG. 2B frame 210 is vacuum-sealed and coupled to a laboratory floor, through base 220. In alternate embodiments, some vibration isolation may be provided between the frame and the laboratory floor. Vacuum pump 215 is connected to vacuum-sealed frame 210, allowing effective evacuation of the vacuum-sealed frame (reaching high vacuum). Charged particle optics 295 is mechanically coupled to the vacuum-sealed frame 210. The charged particle optics can be used to generate and control a beam or beams of charged particles, directed onto the stage.

The wafer chuck 242 will require a high voltage supply. Most embodiments will have a high voltage supply (not shown) external to the stage; thus requiring a high voltage connector (not shown) between the stage and supply. In the case where the frame is vacuum-sealed, the connector will need to be vacuum compatible and the high voltage supply may conveniently be placed outside the vacuum-sealed frame. The connector can be attached to the wafer chuck from below in such a way as to avoid contact with the legs 270 during motion and care must be taken when designing the connector to minimize the transfer of mechanical impulses and vibrations along the connector.

In FIG. 2C the construction of platform 240 is shown in detail for a particular embodiment. The platform actuator carriers 246 and the wafer chuck support 248 are attached to the platform beams 245. The leg brackets 249 are attached to the wafer chuck support 248; the legs 270 may be attached to leg brackets 249 by second attachment members 260.

Stage 200 is a device providing a work platform positionable to high precision. When coupled to a computer control system including position sensors, such as a laser interferometer, stage 200 can provide controllable positioning of platform 240 such that a point on the platform can be positioned to within at least a micrometer relative to a reference position, such as the position of lithography optics 295. In most embodiments, platform 240 has six degrees of freedom of movement. In reference to the coordinate system shown in FIG. 2A, the platform may translate along three axes (x, y, z) and rotate about each axis ($\theta_x$, $\theta_y$, $\theta_z$). While the platform has six degrees of freedom of movement, it is noteworthy that the motions of the platform are over a range determined by the length of legs 270, and the range of movement of platform movement member 290 and raising members 285. Hereinafter, the stage according to this invention may be referred to equivalently as a 'leg stage', due to its novel legged configuration. Note that in a preferred embodiment the platform movement members 290 principally control movement in x, y and $\theta_z$ and the raising members 285 principally control movement in z, $\theta_x$ and $\theta_y$.

In FIG. 2A, legs 270 act as supporting elements for the weight of platform 240. In addition, the legs are also advantageous for electrical isolation in embodiments of the invention where there are large differences in electrical potential between elements. In embodiments where a high voltage workpiece rests on the platform, the legs may act to isolate the high voltage workpiece from other elements of stage 200 if the legs are constructed of substantially electrically insulating material. In other embodiments, additional electrical isolation of the workpiece may be accomplished by constructing the platform of substantially electrically insulating material, such as alumina-based ceramic; more specifically, the platform beams 245, platform actuator carriers 246 and wafer chuck support 248 shown in FIG. 2C may be fabricated of insulating material. Positioning platform movement members 290 away from the center of the platform, where the high voltage workpiece may be, is also an aspect of electrical isolation in a preferred embodiment.

In FIG. 2A, platform 240 is free to move relative to frame 210. An aspect of the motion is accomplished with platform movement member 290.

For lithography applications of stage 200 a wafer chuck 242, which is part of platform 240, is used to hold a wafer 244 during lithographic processing.

The use of lightweight materials such as alumina-based ceramic for constructing the stage platform 240 and legs 270, is an important contribution to achieving a low-mass high precision stage; design is also optimized to reduce weight, for example the alumina legs may be hollow, the alumina platform beams 245 may be 'U' shaped in cross-section and the alumina platform actuator carriers 246 may have carrier holes 247. The embodiment shown in FIG. 2C shows such a lightweight design. FIGS. 3A–3E illustrate platform movement members 290 for a preferred embodiment of this invention. The platform movement members provide controllable planar motion of platform 240 relative to frame 210. In a preferred embodiment shown in FIGS. 3A–3E, the platform movement members are comprised of four platform actuators, more specifically four electromagnetic platform actuators.

Figure 3A:
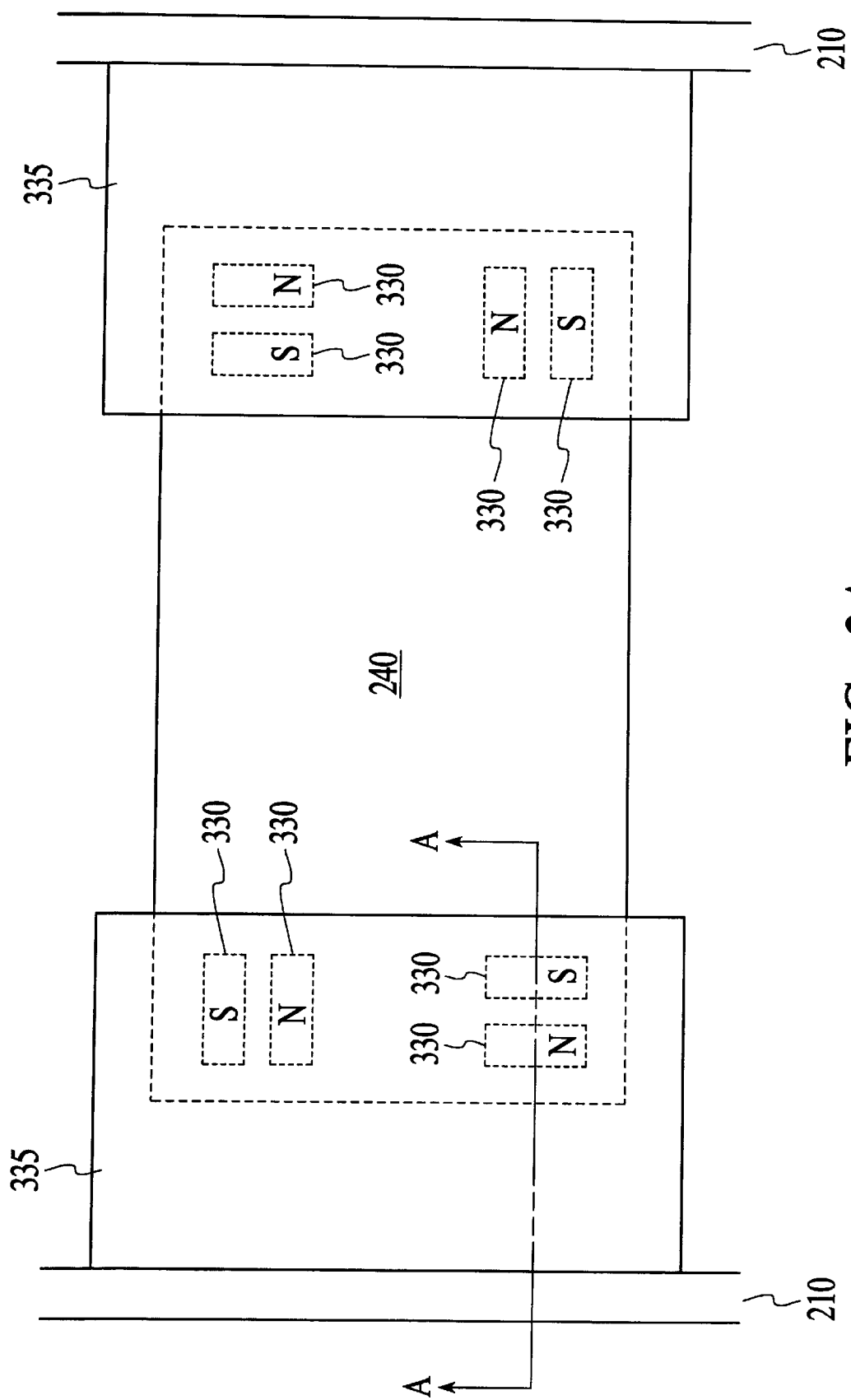
FIG. 3A shows a diagrammatic plan view of the platform movement member, showing magnet configuration.
Figure 3B:
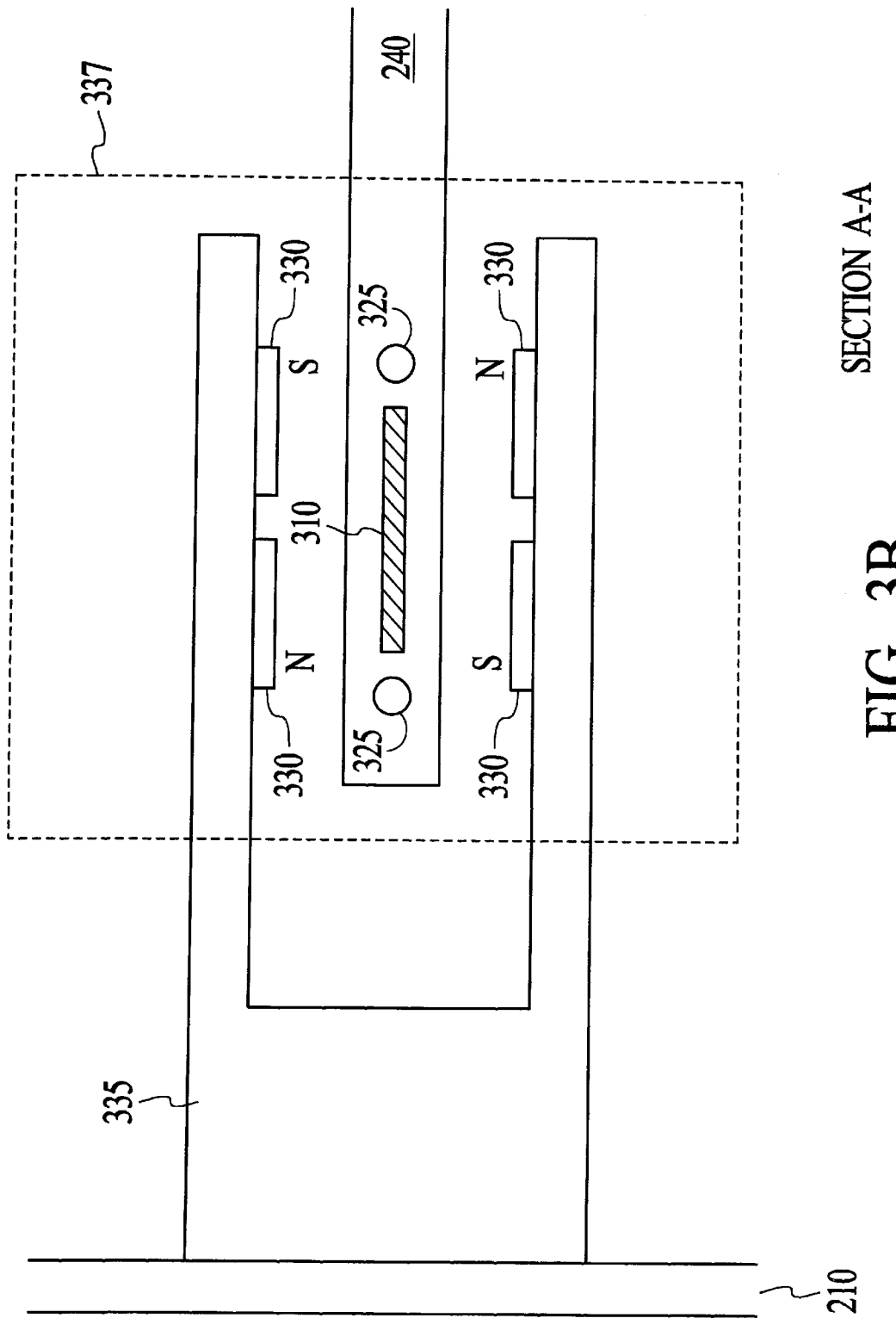
FIG. 3B shows a diagrammatic cross-sectional view of the platform movement member of FIG. 3A, along A–A', showing relative placement of magnets and coil.
Figure 3C:
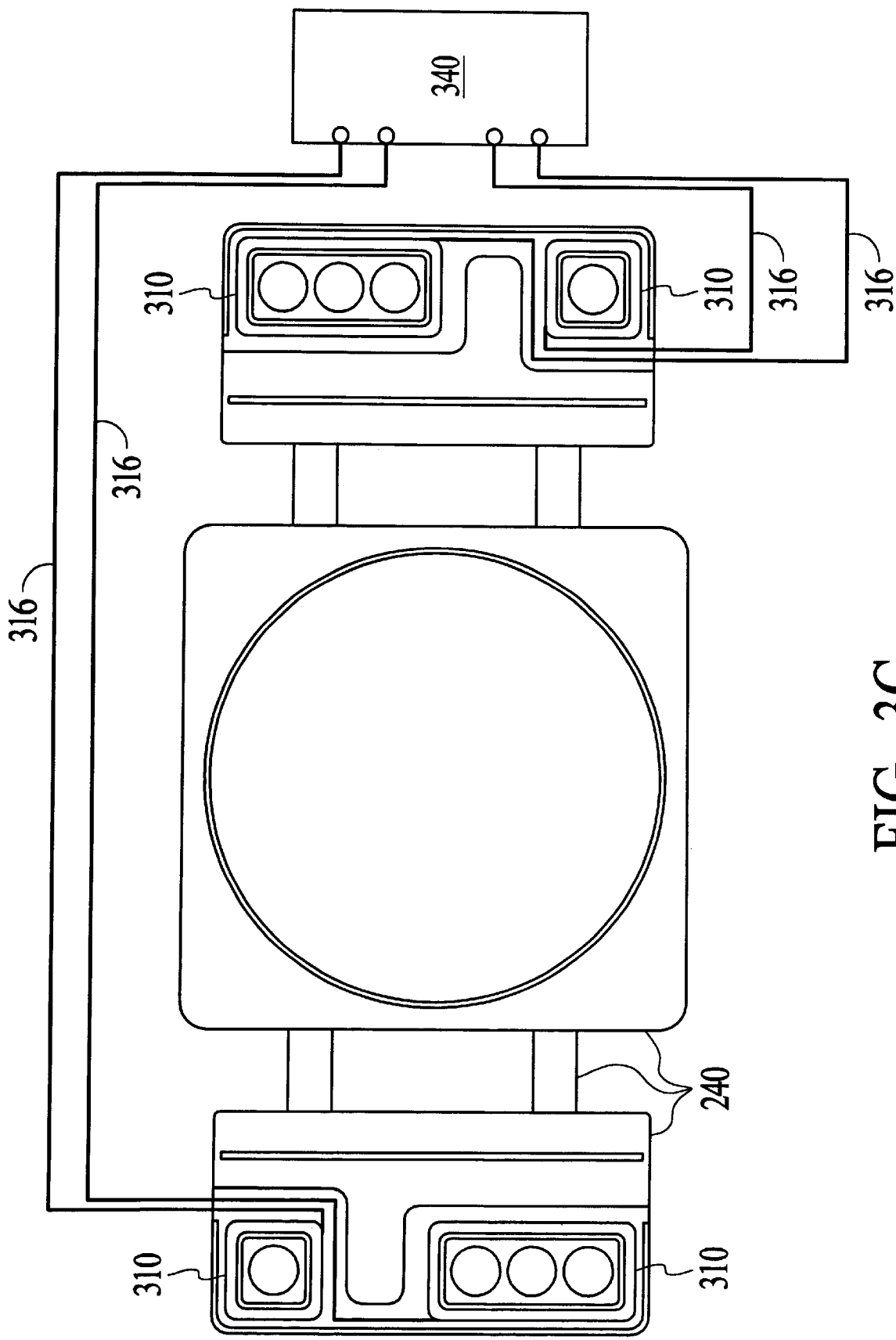
FIG. 3C shows a plan view of the stage platform, showing the drive coils and a schematic representation of the current control system.
Figure 3D:
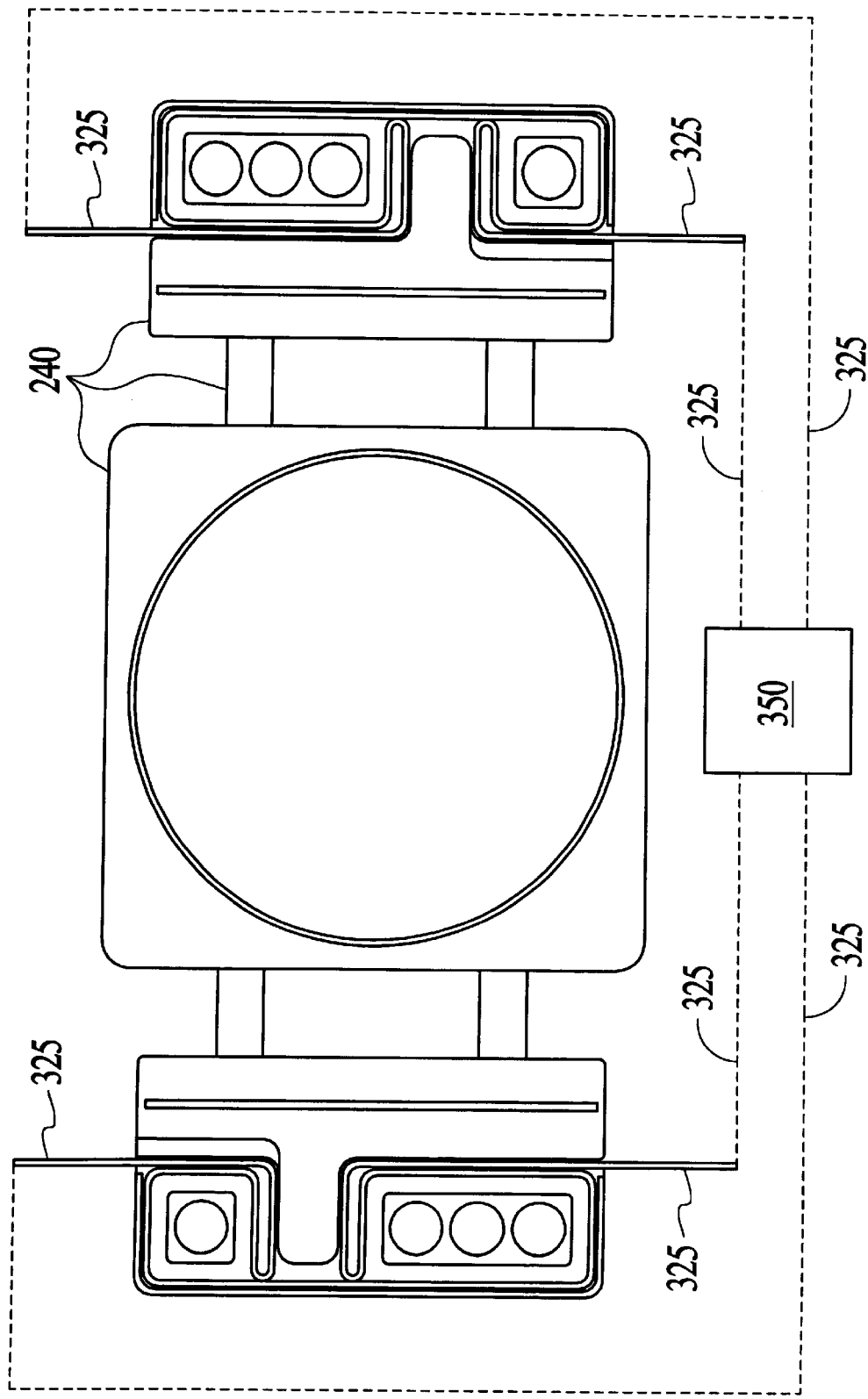
FIG. 3D shows a plan view of the stage platform, showing the cooling lines and a schematic representation of the cooling circuit.
Figure 3E:
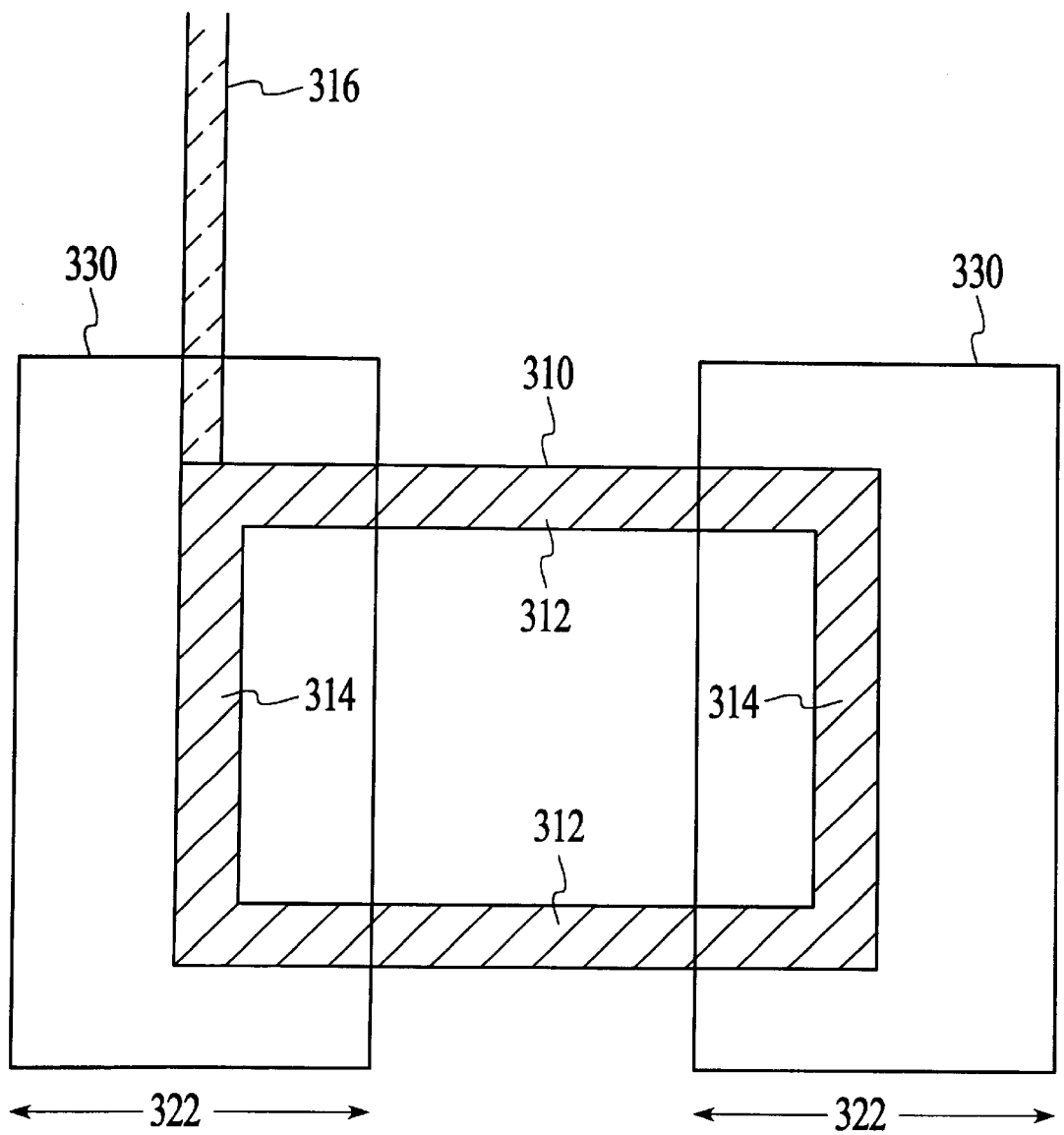
FIG. 3E is a schematic illustration of the superposition of the magnets and first coils.

In FIG. 3A, frame 210, platform 240, magnets 330 and magnet supports 335 are shown. FIG. 3B is a cross-sectional view from the plane AA' of FIG. 3A. In FIG. 3B, frame 210, platform 240, first coil 310, cooling channels 325, magnets 330, magnet supports 335 and electromagnetic platform actuator 337 are shown. FIGS. 3C and 3D show plan views of systems integral to the platform movement member for a preferred embodiment. In FIG. 3C, platform 240, current control system 340, first coils 310 and first coil connecting cables 316 are shown. In FIG. 3D, platform 240, cooling channels 325 and cooling system 350 are shown. In FIG. 3E, one of first coils 310, first coil connecting cable 316, magnets 330, first coil leg 312, second coil leg 314 and magnet dimension 322 are shown.

In FIGS. 3A and 3B magnets 330 are attached to magnet supports 335, with N and S poles placed so as to form magnetic circuits according to well-known principles; this magnet configuration and magnet support together are referred to as a first magnet assembly. The magnet supports are attached to frame 210. First coils 310 are attached to platform 240 and are electrically coupled to current control system 340 (see FIG. 3C). The flow of electrical charge through the first coils in the presence of a magnetic field due to the first magnet assembly results in a Lorentz force (dF=IdIXB, where dF is a differential Lorentz force exerted by magnetic field B on a differential first coil element dI carrying electrical current I) being exerted on the first coils by the magnetic field. Since the first coils are attached to the platform, continuous and finely controllable planar (x, y) motion of the platform relative to the frame may be accomplished by precise control of the electrical currents in selected first coils. Differential control of the electrical currents supplied to the coils may also allow rotation of the platform about the z axis. It is noteworthy that different magnet assemblies and corresponding first coils may contain differently sized magnets and first coils, or carry different electrical currents. The sizes and positioning of the magnets, first coils, and the magnitude of the electrical current flowing through the first coils are determined by the force and travel requirements in a particular direction of motion.

FIG. 3C illustrates a configuration of first coils 310 on platform 240 according to aspects of this invention. For the particular embodiment in FIG. 3C, the configuration of first coils 310 minimizes the magnetic field strength at the center of platform 240. As described above, attention to the magnetic field strength over the platform is important in embodiments where the platform is an element in a charged particle lithography system. In such systems, stray magnetic fields can act to deflect the charged particles and may corrupt desired patterns formed by the charged particles in a resist material; it may be necessary to introduce some magnetic shielding (not shown) to keep stray magnetic field strength within acceptable limits. In embodiments of the leg stage 200 where stray magnetic fields are insignificant, it may be advantageous to arrange the first coils on the platform differently than shown in FIG. 3C. For example, the first coils could be arranged in a mirror image configuration, such that like-sized coils face each other, rather than being diametrically opposed as in FIG. 3C; also coils could be arranged so as to minimize the moment about the center of gravity of the stage.

The electrical resistances of first coils 310 dissipate a fraction of the electrical energy supplied to them, converting it to sensible heat. Cooling system 350 removes heat generated by the first coils, maintaining a desired reference temperature at the center of the platform to within better than +/−0.1 degrees Celsius. The cooling system 350 may comprise closed circuit channels for flow of coolant, a pump, and a device for regulating the temperature of the coolant. Coolant channels 325 according to an exemplary embodiment are shown in FIG. 3D. Other cooling techniques are readily apparent to those skilled in the art.

In most embodiments the current control system 340 and cooling system 350 may conveniently be placed outside the frame 210. In the case where the frame 210 is vacuum-sealed, the coolant channels 325 and first coil connecting cables 316 will need to be vacuum compatible. The channels and cables can be attached to the wafer chuck from below in such a way as to avoid compromising the motion of legs 270 during movement of the stage. Care must be taken when designing the channels and cables to minimize the transfer of mechanical impulses and vibrations along the channels and cables.

FIG. 3E shows the superposition of the magnets 330 and first coil 310. The motive force on the coils is the Lorentz force acting on the electrons flowing in the first and second coil legs. From FIG. 3E, it is apparent that the Lorentz forces on opposing first coil legs 312 will substantially cancel each other. This is the case since the current paths in the opposing first coil legs, which are acted upon by like magnetic fields, are in opposite directions. Therefore, the range of motion of the coils relative to the magnets is determined by width 322. It is noteworthy that the exemplary embodiment shown in FIG. 3E is a non-commutated motor. In applications requiring limited ranges of motion, non-commutated motors are preferred. However, in applications that require much larger ranges of motion, commutated linear electromagnetic motors, which are well-known in the art, may be used.

For embodiments in which the platform movement members are linear actuators, then a minimum of three such actuators will be needed to provide motion with three degrees of freedom, as discussed above.

Figure 4:
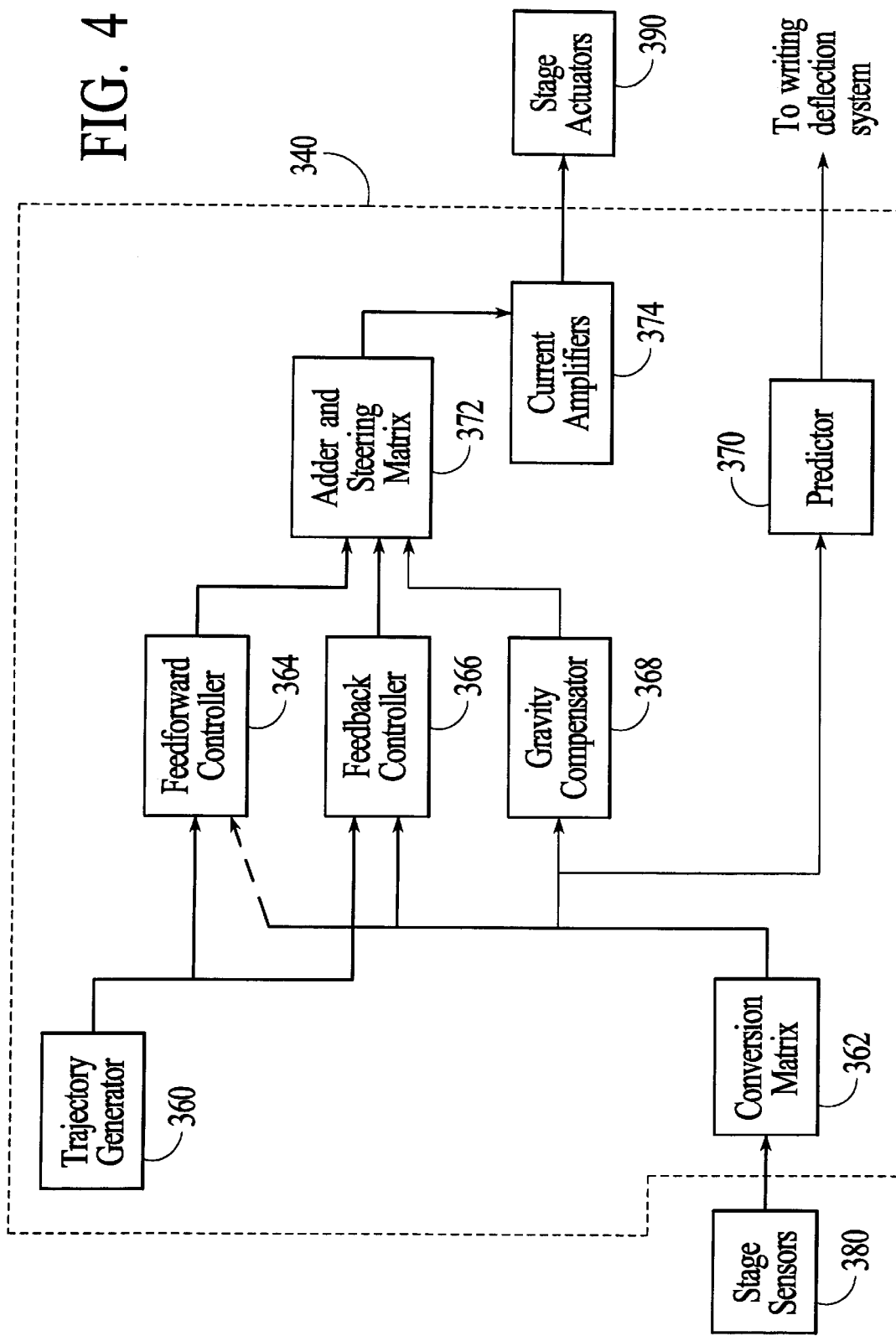
FIG. 4 shows a block diagram of a preferred embodiment of the electrical current control system.
Figure 6A:
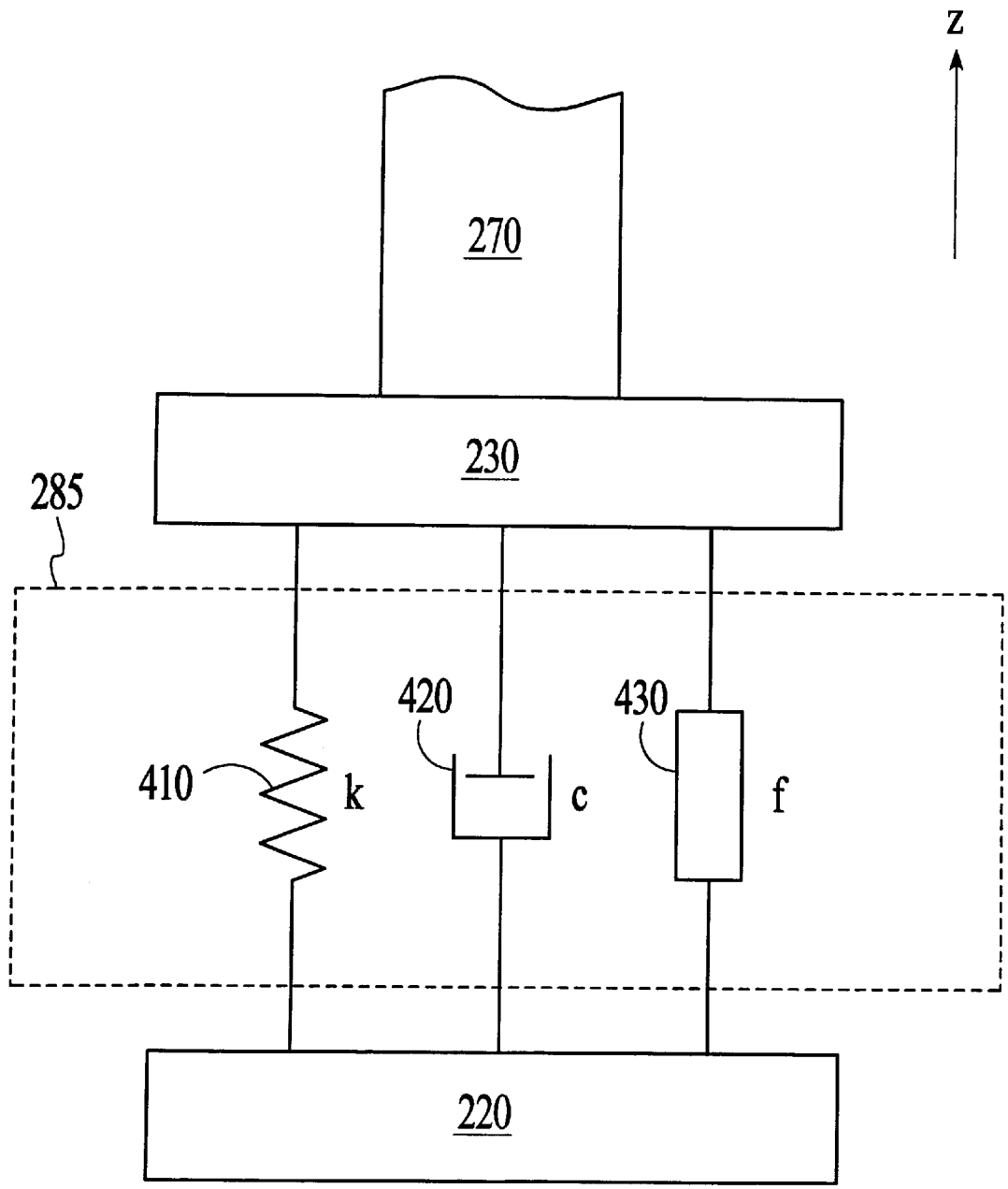
FIG. 6A is a schematic representation of a raising member.
Figure 6B:
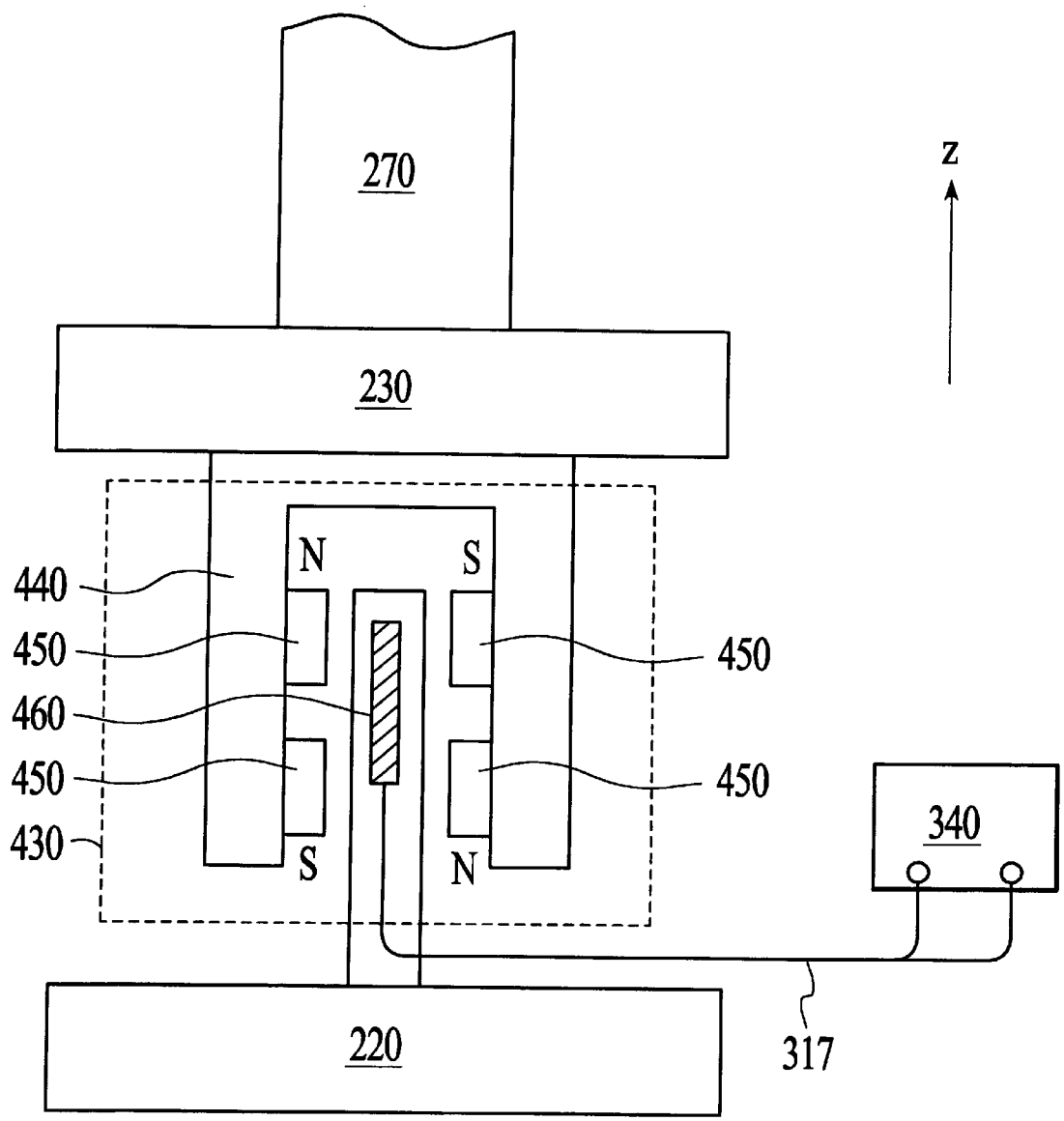
FIG. 6B is a diagrammatic illustration of a first design of the raising actuator.

FIG. 4 shows a block diagram of a preferred embodiment of current control system 340 as an integrated control system for stage 200 (see FIG. 2A, FIG. 3C and FIG. 6B). In FIG. 4, current control system 340, trajectory generator 360, conversion matrix 362, feedforward controller 364, feedback controller 366, gravity compensator 368, predictor 370, adder and steering matrix 372, current amplifiers 374, stage sensors 380 and stage actuators 390 are shown. The stage actuators comprise platform movement member 290 and raising actuators 430 (see FIG. 2A).

Current control system 340 comprises a control system that receives stage position data from stage sensors 380 as input and delivers driving electrical currents for stage actuators 390 as output. The direction of information flow is indicated in FIG. 4.

Current control system 340 receives data input from stage sensors 380, and converts the data into (x, y, z, $\theta_x$, $\theta_y$, $\theta_z$) coordinates, representing the sensed position of the stage, by conversion matrix 362. These values are sent to gravity compensator 368, feedback controller 366 and predictor 370. Trajectory generator 360 specifies desired coordinates (x, y, z, $\theta_x$, $\theta_y$, $\theta_z$) as a function of time from stored values. These sets of values are sent to feedforward controller 364 and feedback controller 366.

As described, sets of coordinates for the actual and sensed positions are fed into feedback controller 366, which compares the desired position with the sensed position and calculates corrective signals to adjust the position of the stage. Trajectory generator coordinates are input to feedforward controller 364, which determines the platform acceleration and generates corrective signals to drive the platform to the desired coordinates. In particular embodiments, the feedforward controller may be adaptive, in which case input is received from the conversion matrix 362. Gravity compensator 368 receives sensed coordinates and generates signals compensating for the inverted pendulum behavior of platform 240. The compensator 368 can be considered as part of the feedforward controller 364. Predictor 370 receives sensed coordinates and generates signals to a writing deflection system to anticipate the position of platform 240 so that lithographic patterns can be correctly placed.

In FIG. 4, if feedforward controller 364 is accurate, then feedback controller 366 will generate null corrective signals. Otherwise, corrective control signals are combined and signals sent to current amplifiers 374 are generated by adder and steering matrix 372. The current amplifiers generate currents proportional to the control signals for driving stage actuators 390. It is noteworthy that, since the process of position sensing takes time, there is a predictable error between the actual position of platform 240 and its sensed position at any time. This error is to overcome by predictor 370 anticipating the position of the platform 240. Also noteworthy is that current control (as opposed to voltage control) of the stage actuators in particular embodiments may provide vibration isolation for the stage.

Figure 5:
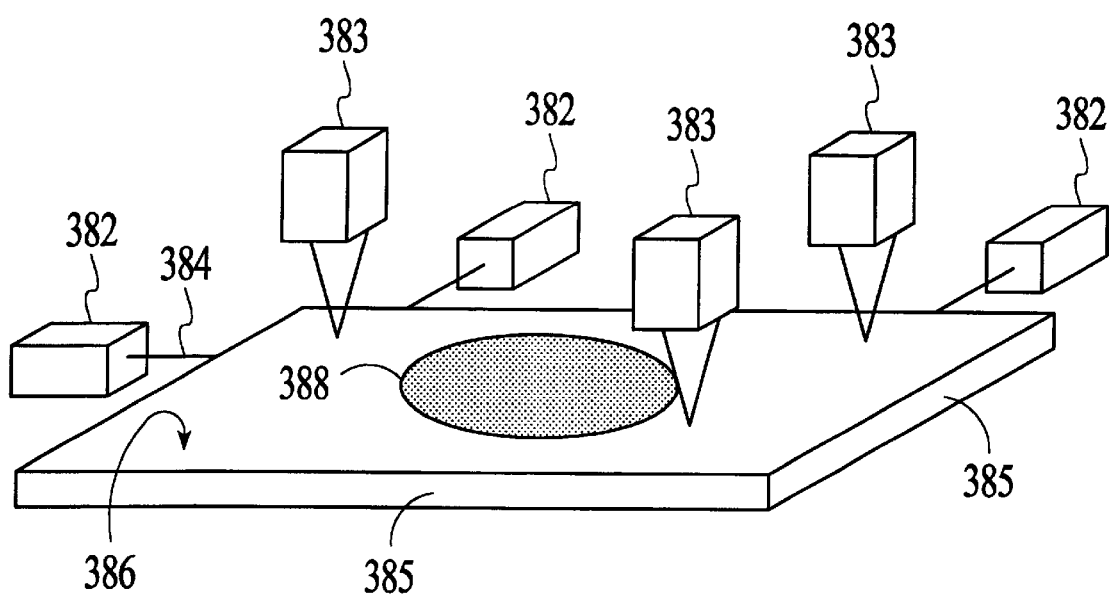
FIG. 5 is a diagrammatic illustration of a preferred embodiment of the stage sensors.

FIG. 5 shows a preferred embodiment of stage sensors 380. In FIG. 5, laser interferometers 382, laser beams 384, reflective side surfaces 385, reflective top surface 386, platform center 388, and laser triangulators 383 are shown. Platform center 388, where a wafer may be placed, is not reflective. In a preferred embodiment, reflective top and side surfaces 386 and 385, respectively, are formed of one piece of material such as quartz or Zerodur™ glass and are integral to platform 240 and all interferometers 382 and triangulators 383 are attached to a common support structure (not shown). The support structure, in turn, is rigidly attached to the charged particle optics (see 295 in FIG. 2B). In a preferred embodiment the one piece of material forming 385 and 386 is relieved on the backside in order to reduce the weight of the stage.

In FIG. 5, laser interferometers 382 generate laser beams 384, which are reflected off the reflective side surfaces 385 of wafer chuck 242 (see FIG. 2A). The reflected laser beam generates an interference pattern upon combination with the incident beam, which allows changes in the position of the platform 240 to be accurately determined. Laser triangulators 383 provide a measure of the absolute distance between the triangulator and the reflective top surface 386 of platform 240. The platform position is determined relative to the support structure to which all of the interferometers and triangulators are attached, and hence to the charged particle optics.

In order to determine the starting position of the platform in the horizontal plane, from which relative motion is measured using the interferometers, an alignment procedure between the platform and lithography optics must be followed. There are various alignment procedures that are well known to those skilled in the art of semiconductor lithography, that may be used here.

As illustrated in FIG. 2A, platform 240 is attached to base 220 by legs 270 and the base is fixed to frame 210. In the embodiment shown in FIG. 2A, as platform movement members 290 articulate the platform relative to the frame, a change in an elevation of the platform relative to the base results since the legs have a constant length. To compensate for this change in the platform elevation, stage 200 incorporates platform-raising members. Also, differential actuation of the platform raising members may result in rotations of the platform about the x and y platform axes 280.

FIG. 6A is a schematic of an embodiment of a raising member. In FIG. 6A, one of legs 270, base 220, first attachment member 230, raising member 285, support element 410, damping element 420, and raising actuator 430 are shown. In FIG. 6A, raising member 285, support element 410, damping element 420, and raising actuator 430 are attached to the base and the attachment member. In one such embodiment the base is coupled to the laboratory floor (not shown).

In the particular embodiment shown in FIG. 6A, support element 410 provides a supporting force that is dependent on the separation between first attachment member 230 and base 220. In general, a force provided by the support element may enhance the control performance of the raising actuator by reducing the load that the raising actuator is required to carry. Damping element 420 provides a force in opposition to relative motions of the attachment member and base proportional to a time rate of change of their relative positions. In this embodiment, the support element and the damping element are passive. Raising actuator 430 is an active and controllable element in combination with a computer control system (not shown). FIG. 6A shows the case where motion is allowed in the z direction and constrained in all other directions. When the raising members are constrained to move linearly, then there will need to be at least 3 legs, with one such raising member attached to each leg, in order to give motion with three degrees of freedom, as described above.

In alternate embodiments, support element 410 may provide a supporting force that is independent of the separation between first attachment member 230 and base 220 (a constant force support). The support element and damping element may also be a single element such as a visco-elastic beam. In a preferred embodiment, the support element and damping element are a single element comprising elastic structures loaded to a degree approaching a point of elastic stability (e.g. a buckled column), as taught in U.S. Pat. No. 5,310,157. A low structural stiffness in this preferred embodiment may also be advantageous with respect to isolation of platform 240 from vibration. Alternative embodiments may consist simply of a raising actuator, a support element and raising actuator in parallel, or a damping element and a raising actuator in parallel.

FIG. 6B shows an embodiment of the raising actuator where the raising actuator is an electromagnetic raising actuator. In FIG. 6B, one of legs 270, base 220, first attachment member 230, raising actuator 430, second magnet support 440, second magnets 450, second coil 460, electrical cables 317 and current control system 340 are shown.

In FIG. 6B, raising actuator 430 is attached to the base 220 and first attachment member 230. In one such embodiment, base 220 may be coupled to the laboratory floor (not shown). Second magnets 450 are attached to second magnet support 440, with N and S poles placed so as to form a magnetic circuit according to well known principles; this magnet configuration and magnet support together are referred to as a first magnet assembly. The magnet support 440 is attached to first attachment member 230. Second coil 460 is attached to the base and is electrically coupled by electrical cables 317 to current control system 340. According to well-known principles described above, the electrical currents in the coil result in a Lorentz force being exerted on the attachment member by the magnetic field. Thus, continuous and finely controllable motion of one of legs 270 relative to the base is accomplished by precise control of the electrical currents in the second coil. The control of the electrical currents in the coils is provided as described above (see FIG. 4). In combination with platform movement member 290, the raising actuators allow precise positioning and movement of platform 240 (see FIG. 2).

Figure 6C:
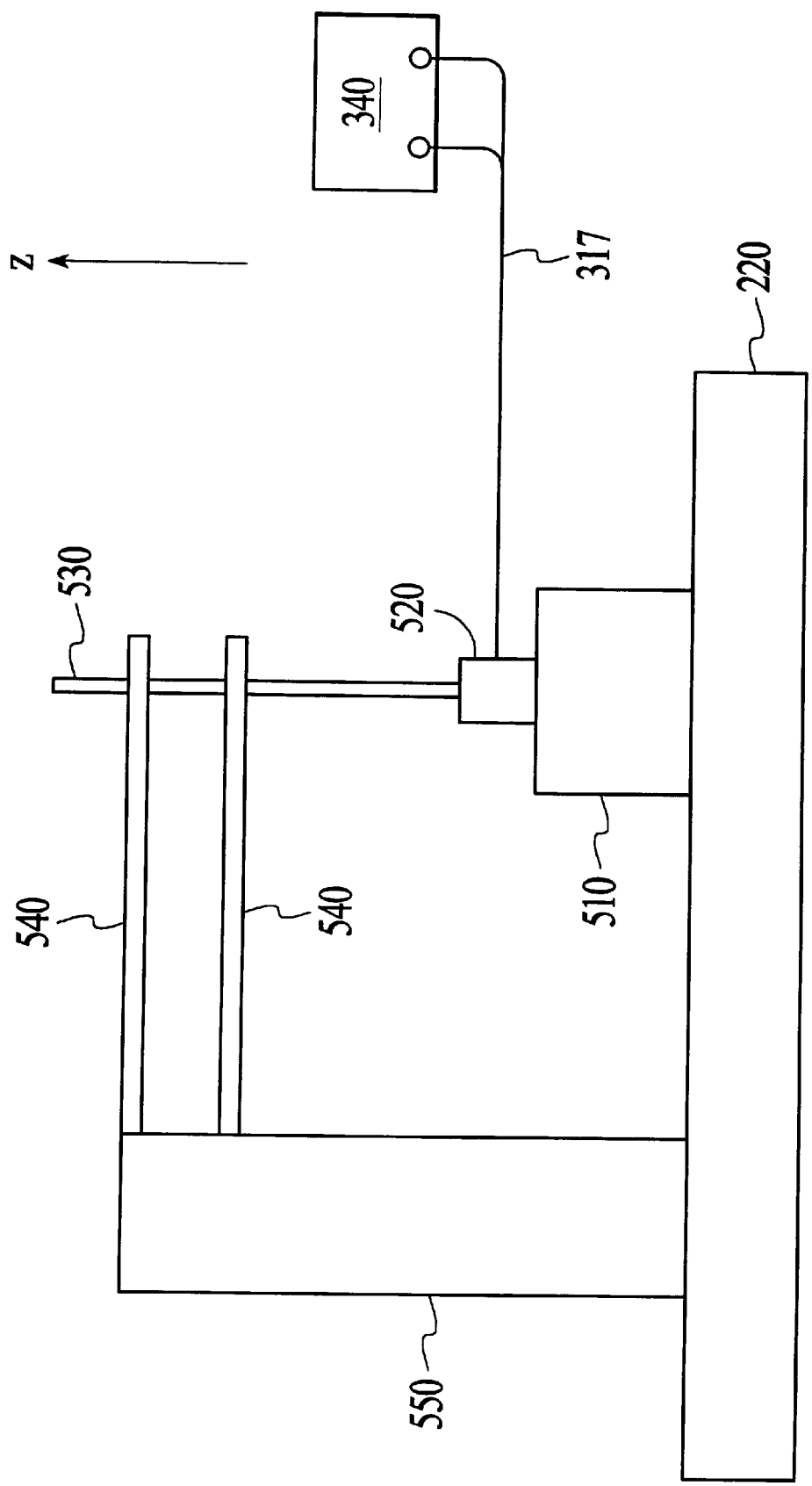
FIG. 6C is a diagrammatic illustration of a second design of a raising actuator, shown as a side view.
Figure 6D:
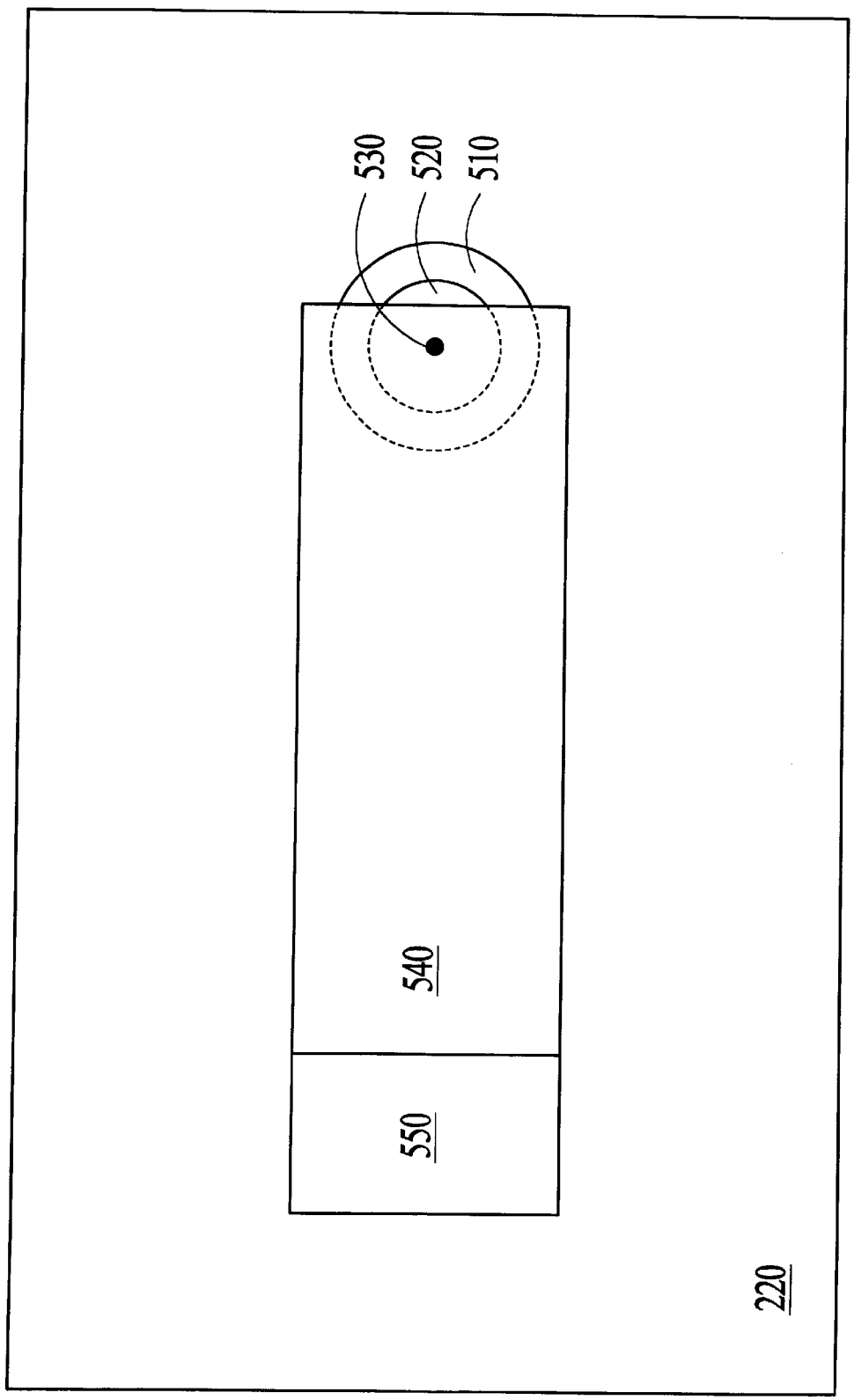
FIG. 6D is a diagrammatic illustration of a second design of a raising actuator, shown as a top view.

FIGS. 6C and 6D show another embodiment of raising member 285. In FIGS. 6C and 6D, the raising actuator is a voice coil actuator. In FIGS. 6C and 6D, base 220, voice coil magnet 510, voice coil 520, shaft 530, thin beam 540, rigid support 550, electrical cables 317 and current control system 340 are shown.

In FIG. 6C, the raising actuator is attached to base 220 and comprises voice coil magnet 510 and voice coil 520. The voice coil is attached to shaft 530. Shaft 530 is coupled to first attachment member 230 (not shown). Thin beams 540 are attached to a rigid support 550, which is attached to the base. The shaft 530 passes through thin beams 540, but is not fixed to them.

Referring to FIG. 6C, voice coil 520 moves in the z direction when an electric current flows through it. The current passing through coil 520 is controlled by current control system 340 in a manner similar to that described above. Movement of the shaft is constrained in all but the z direction by flexible thin beams 540 and rigid support 550. A sp ring (not shown) may be incorporated between the voice coil magnet and the thin beams, the spring axis coaxial with shaft 530.

A preferred embodiment of the raising member is a Nano-k™ vibration isolator model no. SP1014 and serial numbers 317, 318 and 319 fabricated by Minus k Technology, Inc., which is fabricated using the designs and teaching in U.S. Pat. Nos. 5,178,357 5,310,157 5,370,352

5,390,892 5,549,270 5,669,594 5,794,909 and 5,833,204 incorporated by reference herein, combined in parallel with a BEI Electronics moving coil actuator model no. LA25-42-000A, which is fabricated using the designs and teaching in U.S. Pat. No. 5,345,206 incorporated by reference herein. Note that the use of a metallic coil carrier in the moving coil actuator may provide more than the desired amount of damping, due to Eddy current induction in the carrier; in such cases a non-metallic coil carrier can be used to eliminate this undesired damping. This preferred embodiment of the raising member is a very low spring constant support providing horizontal guidance, which also has a very low natural frequency of motion in the vertical direction, hence providing good vibration isolation. This preferred embodiment of the raising member also has an adjustable spring rate for vertical motion, allowing the natural frequency of the stage to be minimized under varying operating conditions. For example, in some embodiments there is an electrostatic force of attraction between the wafer and the charged particle optics; this force varies non-linearly with separation of the wafer and charged particle optics; this can be compensated for by changing the spring rate as the separation varies.

As shown in FIG. 2A, the motion of platform 240 is constrained by first attachment members 230 and second attachment members 260 at opposite ends of legs 270. In different embodiments of this invention, first attachment members 230 and second attachment members 260 may have either two or three degrees of freedom of movement. In preferred embodiments, the attachment members and second attachment members are flexural joints. Flexural joints are well-known in the art to be capable of smooth, continuous and highly repeatable motion.

Figure 7:
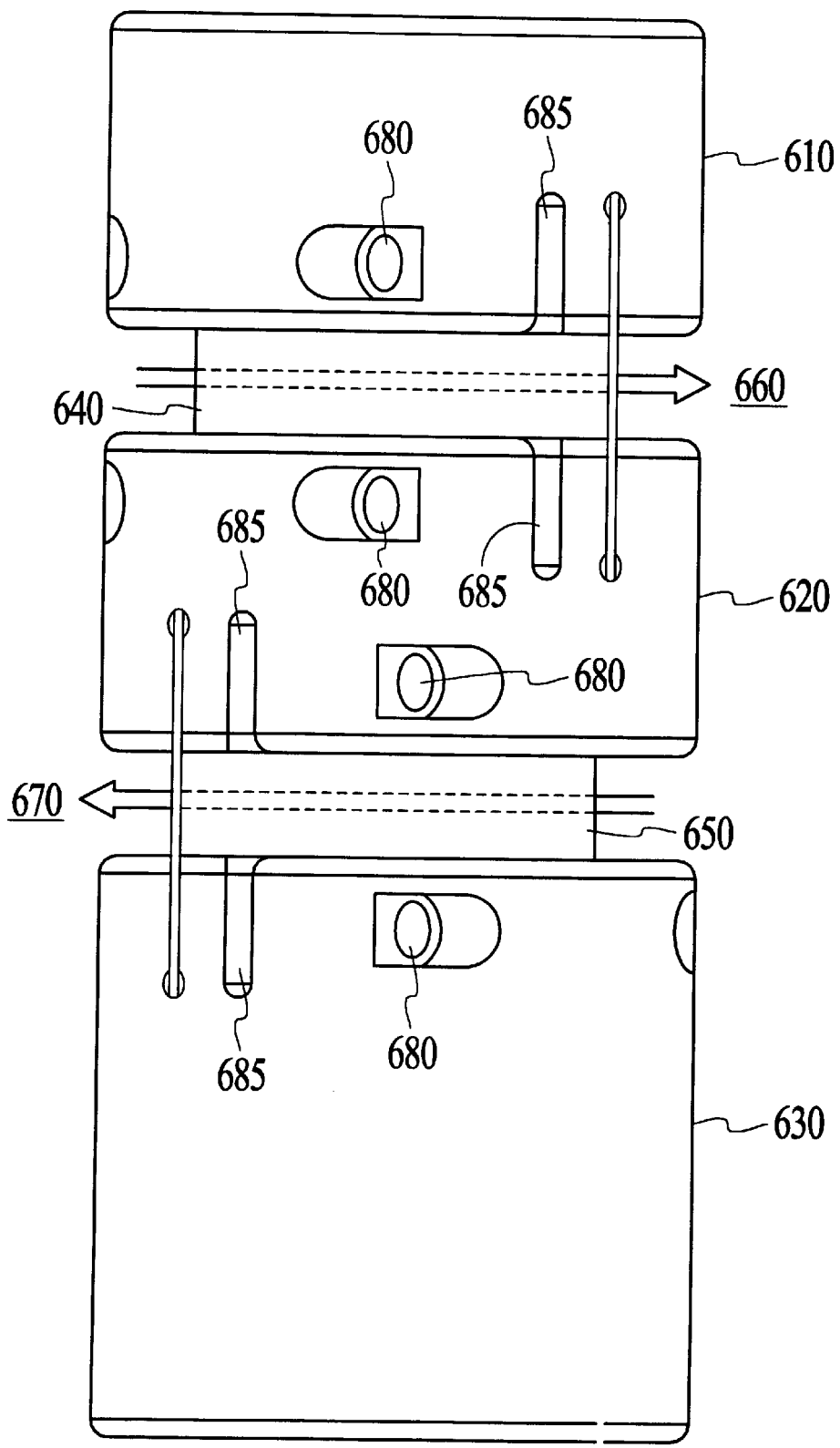
FIG. 7 shows a two degrees of freedom of movement flexural joint.

FIG. 7 shows a preferred embodiment of a two degrees of freedom of movement flexural joint. The flexural joint shown in FIG. 7 is suitable as a first attachment member 230 or second attachment member 260. In FIG. 7, first joint element 610, second joint element 620, third joint element 630, first flexure strip 640, second flexure strip 650, first flex axis 660, second flex axis 670, flexure strip fastener holes 680 and notches 685 are shown.

In FIG. 7, flexure strips 640 and 650 are held in place with fasteners (not shown) inserted in holes 680. The notches 685 run parallel to the grooves into which the flexure strips are inserted; the fasteners apply pressure to the walls of the notches 685, thereby holding the flexures in place in their grooves with the force distributed over the area of the flexure in contact with the wall of the groove. First joint element 610 and second joint element 620 are coupled by first flexure strip 640, defining first flex axis 660. Similarly, second joint element 620 and third joint element 630 are coupled by second flexure strip 650, defining second flex axis 670. The first and second flex axes are axes about which hinge-like motion of the joint elements and connecting flex strips may occur. In a preferred embodiment the first and second flex axes are orthogonal. In preferred embodiments, the first joint element is rigidly affixed to bottom platform surface 650 and third joint element 630 is rigidly affixed to one of legs 270. In preferred embodiments, the first flexure strips and second flexure strips may have a thickness of about 0.010 inches and be made of spring steel, or beryllium/copper alloy, or ASTM grade 304 stainless steel.

As described above, raising actuators 285 are capable of changing the elevation of platform 240 relative to base 210 (see FIG. 2A). To accomplish a raising motion in a preferred embodiment, first attachment members 230 carry a thrusting force. First attachment members 230 may also have three degrees of freedom of movement. A two degrees of freedom of movement flexural bearing such as that illustrated in FIG. 7 may not only lack a desired degree of freedom of movement, but also may be inadequate as a thrust bearing since the flexural joint is prone to distortion or buckling. It is noteworthy, however, that first flexure strip 640 and second flexure strip 650 (see FIG. 7) may be made stiff and short. This may allow the joint to perform acceptably under compression.

Figure 8A:
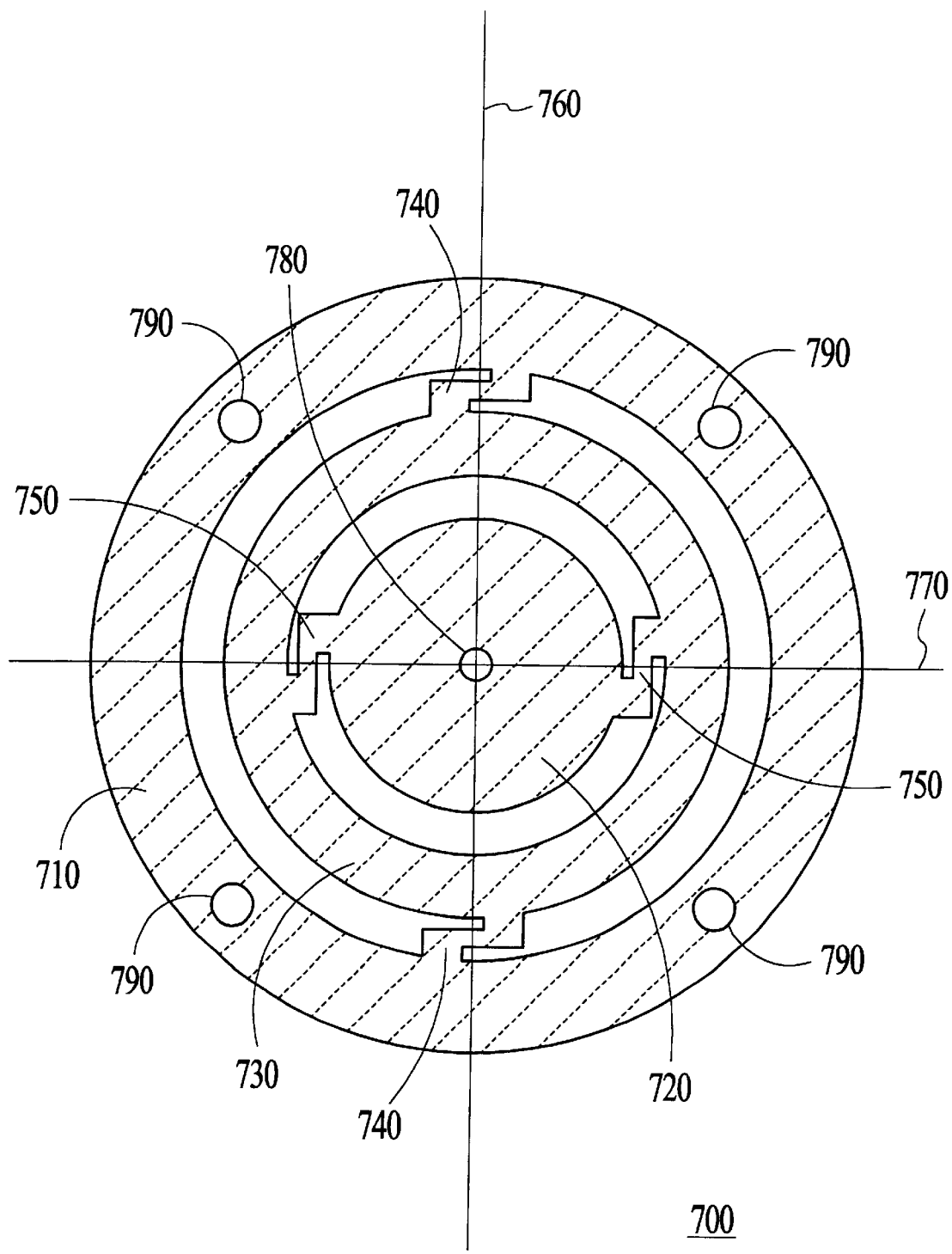
FIG. 8A is a diagrammatic plan view of an embodiment of a three degrees of freedom of movement flexural joint.

FIG. 8A shows a diagrammatic plan view of an embodiment of a three degrees of freedom of movement flexural joint. In FIG. 8A, three degree of freedom of movement flexural joint 700, first joint element 710, second joint element 720, third joint element 730, second flexures 740, first flexures 750, second flex axis 760, first flex axis 770, third flex axis 780, and fasteners 790 are shown. Note that the first and second flex axes are axes about which hinge-like motion of the joint elements and associated flexures may occur; rotation about the third flex axis is due to twisting of either the first, second or first and second flexures.

In FIG. 8A, first joint element 710 and third joint element 730 are coupled by second flexures 740. Likewise, third joint element 730 and second joint element 720 are coupled by first flexures 750. This results in three degrees of freedom of movement for rotations about the second flex axis 760, first flex axis 770, and third flex axis 780, which in this embodiment are all orthogonal. It is noteworthy that the three degrees of freedom of movement flexural joint according to this invention comprises only two flexure hinges. In a preferred embodiment, the three degree-of-freedom of movement flexural joint may be fastened to base 220 with fasteners 790 and rigidly affixed to one of legs 270 (see FIG. 2A). Note that the first joint element 710 may be spaced from the base to which it is attached in order to allow hinging motion of the joint (not shown).

Figure 8B:
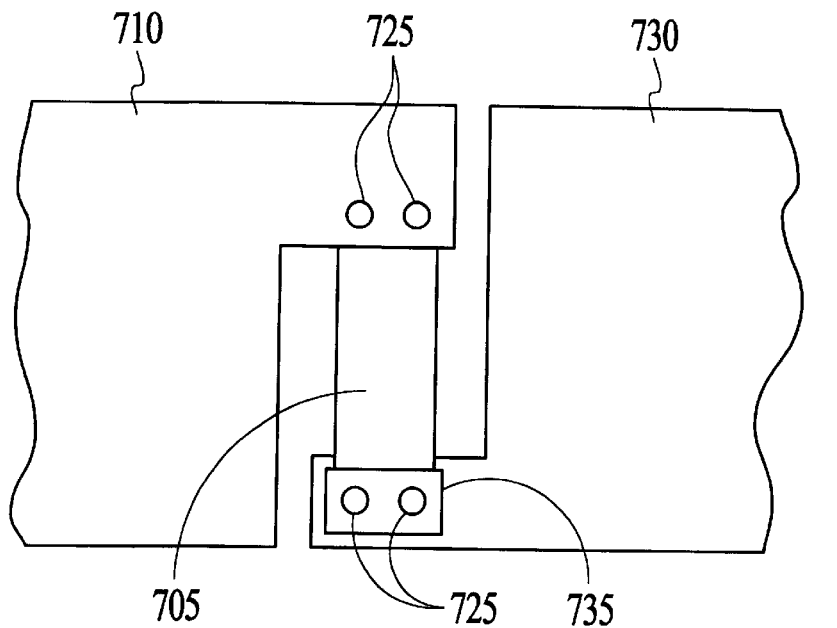
FIG. 8B shows a diagrammatic cross-sectional view of the second flexure hinge from FIG. 8A.
Figure 8C:
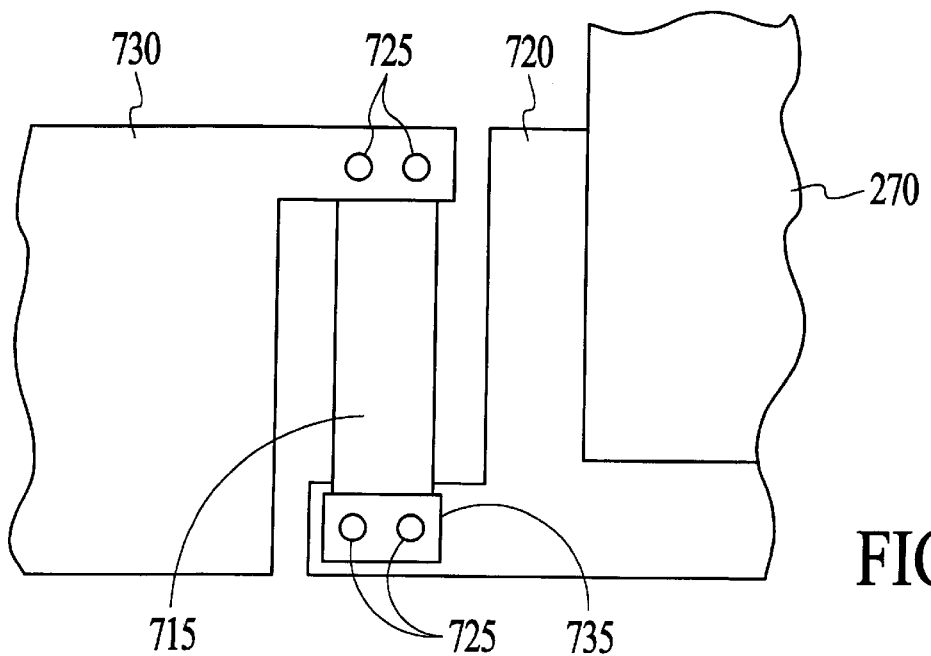
FIG. 8C shows a diagrammatic cross-sectional view of the first flexure hinge from FIG. 8A.

FIG. 8B and FIG. 8C show cross-sectional views of one of second flexure 740 and first flexure 750, respectively. In FIG. 8B and FIG. 8C, first joint element 710, second joint element 720, third joint element 730, second flexure strip 705, first flexure strip 715, fasteners 725, caps 735 and one of legs 270 are shown.

In FIG. 8B, first joint element 710 and third joint element 730 are coupled by second flexure strip 705. The second flexure strip is attached to the first and third joint elements by strip fasteners 725, forming second flexure 740. The cap 735 is used to spread the force from the fasteners evenly over the end of the flexure. Similarly, FIG. 8C shows second joint element 720 and third joint element 730 coupled by first flexure strip 715. The first flexure strip is attached to the second and third joint elements by strip fasteners 725, forming first flexure 750. The cap 735 is used to spread the force from the fasteners evenly over the end of the flexure. It can be appreciated from FIG. 8B and FIG. 8C that the second flexure strips 705 and first flexure strips 715 undergo tensile stresses when three degrees of freedom of movement flexural joint 700 transmits thrust to leg 270 from raising member 285 attached to first joint element 710. It is noteworthy in FIG. 8B and FIG. 8C that the lengths, stiffness and other characteristics of the first and second flexure strips may be different within a particular embodiment. In preferred embodiments, the flexure strips have a thickness of about 0.010 inches and may be made of spring steel, or beryllium/copper alloy, or ASTM grade 304 stainless steel.

Figure 9A:
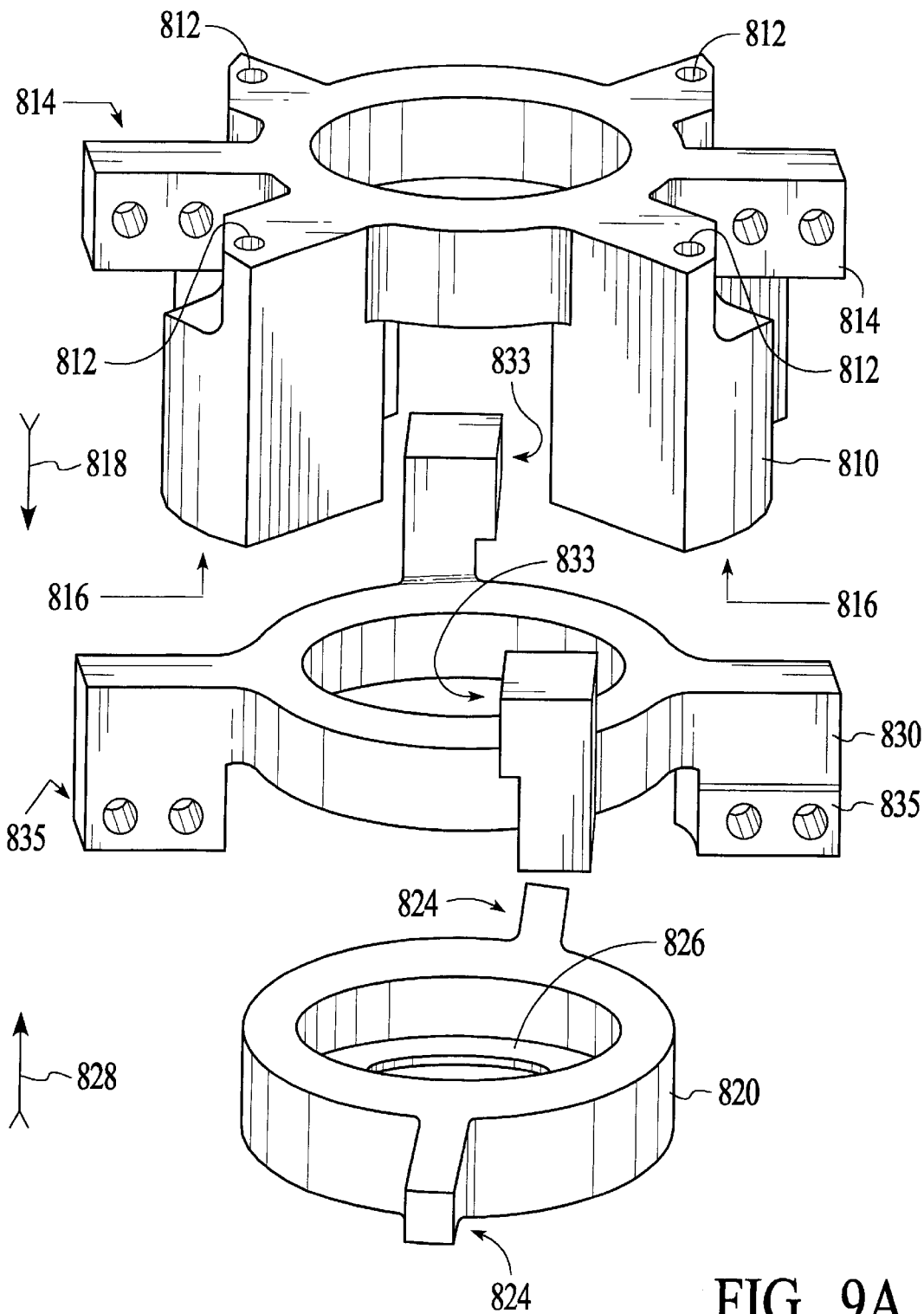
FIG. 9A shows an exploded perspective view of a preferred embodiment of the three degrees of freedom of movement flexural joint.

FIG. 9A shows an exploded perspective view of a preferred embodiment of the three degrees of freedom of movement flexural joint. In FIG. 9A, first joint element 810, fastener clearance holes 812, first flexure strip attachment surfaces 814, first load bearing surface 816, first direction 818, second joint element 820, second flexure attachment surfaces 824, second load bearing surface 826, second direction 828, third joint element 830, upper third flexure attachment surfaces 833 and lower third flexure attachment surfaces 835 are shown. Flexure strips and fastening means are omitted from FIG. 9A for the sake of clarity.

In a typical embodiment, first joint element 810 is coupled to raising member 285 (see FIG. 2A). Second joint element 820 is coupled to one of legs 270 and also to third joint element 830 by two first flexure strips. The third joint element 830 is coupled by two second flexure strips to the first joint element 810. The leg 270 coupled to the second joint element 820 passes through the centers of each of the joint elements. All flexure strips are secured on flexure strip attachment surfaces 814, 824, 833 and 835. The first load bearing surface 816 is the bottom surface of first joint element 810; the load bearing surface contacts raising member 285 in a typical embodiment. The first direction 818 is the direction normal to the first load bearing surface. The second load bearing surface 826 is the recessed surface of second joint element 820, upon which leg 270 sits in a typical embodiment. The second direction 828 is the direction normal to the second load bearing surface. The second direction is opposite to the first direction.

Figure 9B:
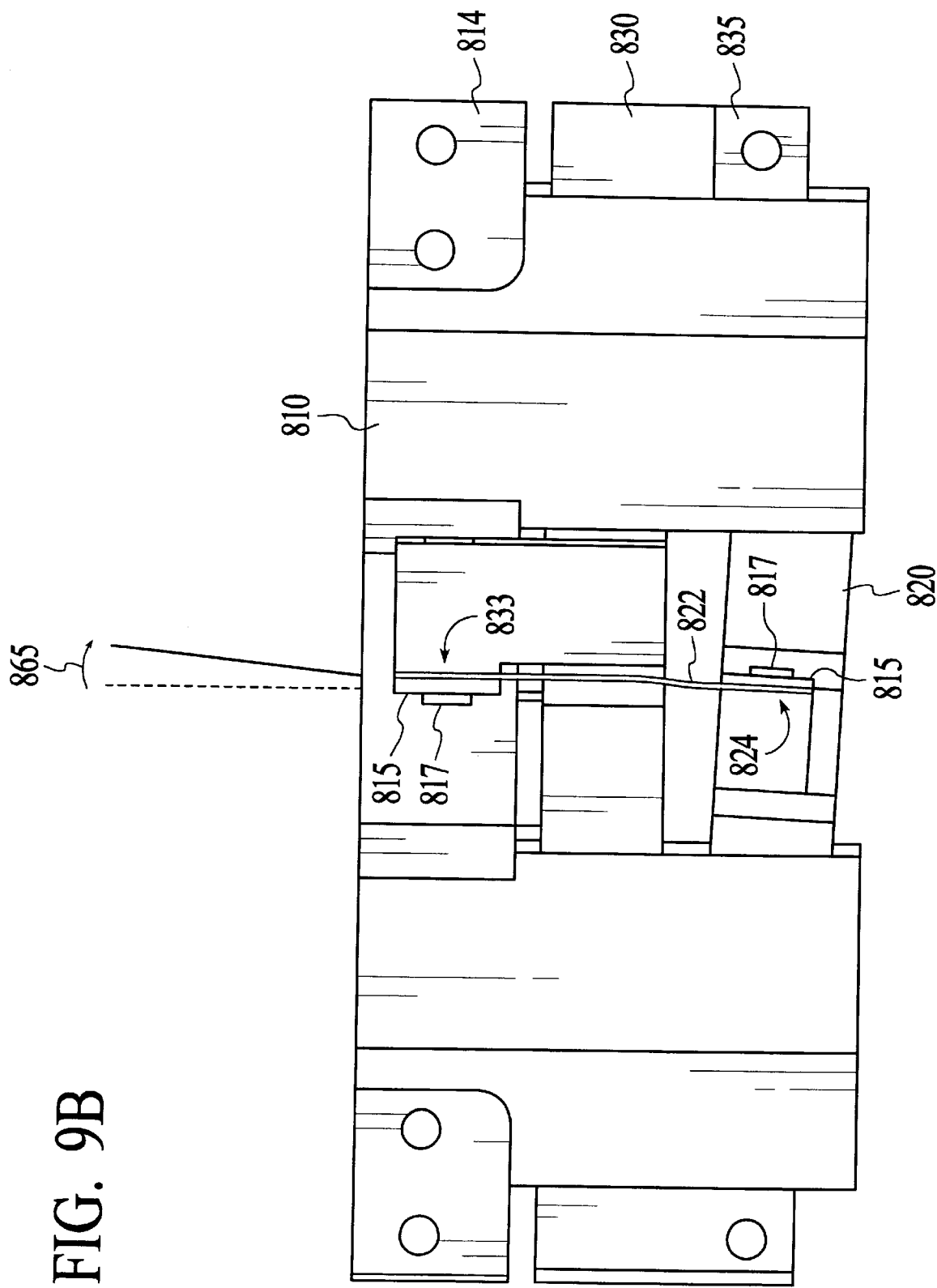
FIG. 9B shows a preferred embodiment of the three degrees of freedom of movement flexural joint with tilt of the leg axis.

FIG. 9B shows a preferred embodiment of the three degrees of freedom of movement flexural joint with tilt of the leg axis. In FIG. 9B, first joint element 810, second joint element 820, third joint element 830, first flexure strip attachment surface 814, caps 815, fasteners 817, first flexure strips 822, second flexure strip attachment surface 824, upper third flexure attachment surface 833, lower third flexure attachment surface 835 and leg axis 865 are shown. Leg 270 and second flexure strips 834, along with their caps and fasteners, are omitted for the sake of clarity.

In FIG. 9B, the joint elements are connected as described above for FIG. 9A. In addition, first flexure strip 822 is fastened on second flexure strip attachment surface 824 and upper third flexure attachment surface 833 by caps 815 and fasteners 817. Note that the second and third joint elements are connected by two first flexure strips, diametrically opposed (see FIG. 9A); only one of the first flexure strips can be seen in FIG. 9B.

FIG. 9B illustrates a degree of freedom of movement of the joint. As first flexure strips 822 bend, second joint element 820 tilts. Note that this motion results in movement of leg axis 865 as shown. (Note that due to the nature of flexure strip distortion under load, there may be some displacement of one joint element with respect to the next in addition to the tilt described above.) Similarly, a second degree of freedom of movement is due to bending of the second flexure strips (not shown).

Figure 9C:
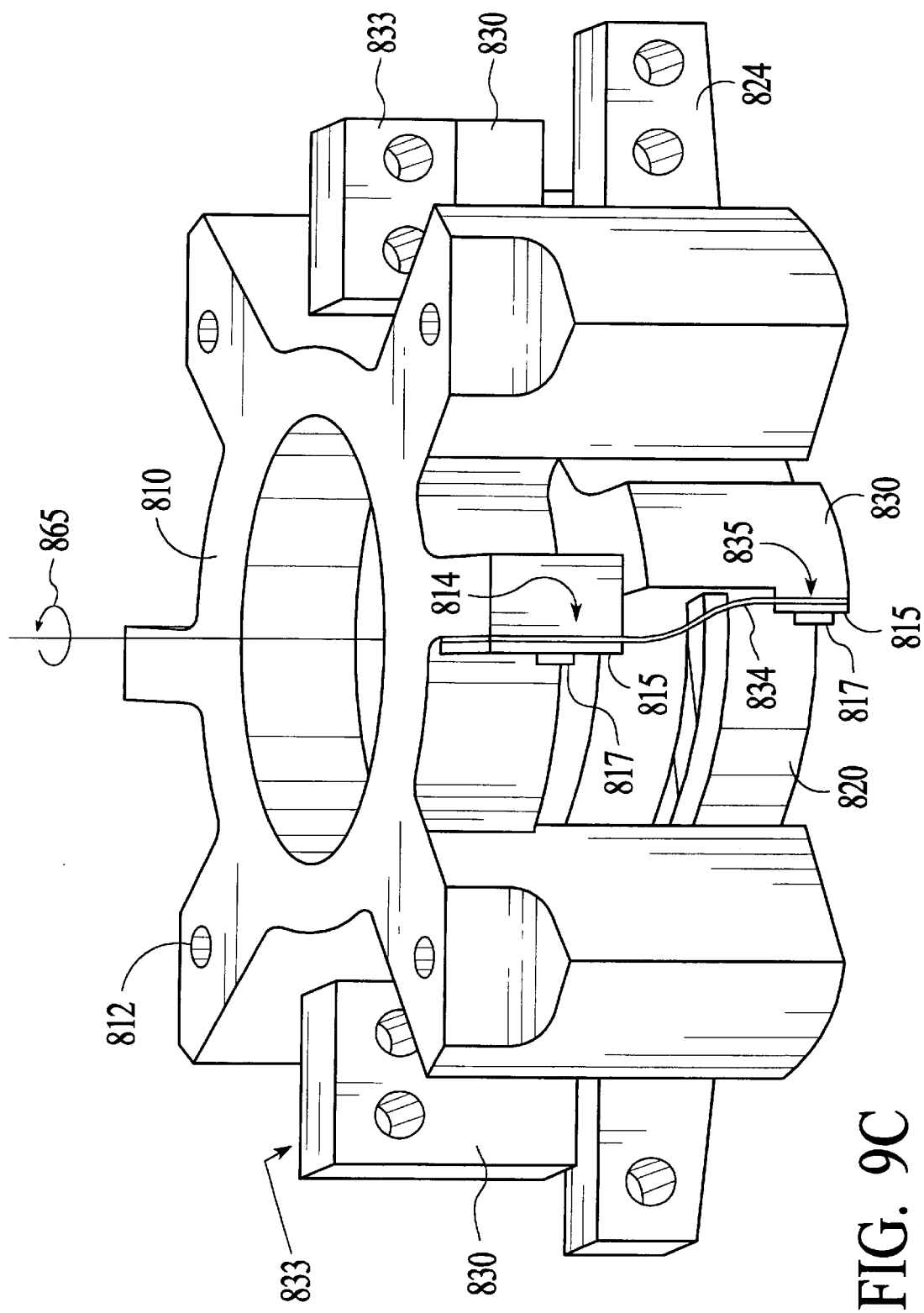
FIG. 9C shows a preferred embodiment of the three degrees of freedom of movement flexural joint with rotation about the leg axis.

FIG. 9C shows a preferred embodiment of the three degrees of freedom of movement flexural joint with rotation about the leg axis 865. In FIG. 9C, first joint element 810, second joint element 820, third joint element 830, fastener clearance holes 812, first flexure strip attachment surface 814, caps 815, fasteners 817, second flexure attachment surface 824, upper third flexure attachment surface 833, second flexure strips 834, lower third flexure strip attachment surface 835 and leg axis 865 are shown. Leg 270 and first flexure strips 824, along with their caps and fasteners, are omitted for the sake of clarity. Elements shown in FIG. 9C are as in FIGS. 9A and 9B.

In FIG. 9C, the joint elements are connected as described above for FIG. 9A. In addition, second flexure strip 834 is fastened on first flexure strip attachment surface 814 and lower third flexure attachment surface 835 by caps 815 and fasteners 817. Note that the first and third joint elements are connected by two second flexure strips, diametrically opposed (see FIG. 9A); only one of the second flexure strips can be seen in FIG. 9C.

FIG. 9C illustrates a third degree of freedom of movement of the joint. As second flexure strips 834 bend and twist, for example as a reaction to a torque about leg axis 865, there is rotational motion of second joint element 820 about leg axis 865. (Note that due to the nature of flexure strip distortion under load, there may be some displacement of one joint element with respect to the next in addition to the rotation described above.)

Thus, as illustrated in FIG. 9B and FIG. 9C, the joint has three degrees of freedom of movement. It is noteworthy in the above that stiffness of the joint may be changed by altering the lengths or material properties of the flexure strips. Note also that the rotational movement of the joint will occur by twisting and bending of both pairs of flex strips; although, the relative amount of twisting and bending will depend on the lengths and stiffnesses of the two pairs of flexure strips. In the preferred embodiment most of the twisting occurs in the longer second flexure strips (both sets of strips having the same stiffness).

FIGS. 9A–9C show a preferred embodiment of the three degrees of freedom of movement flexural joint. In comparison to the embodiment shown in FIG. 8A where the joint elements are both concentric and coaxial, the joint elements in this preferred embodiment are coaxial, but not concentric. This contributes to freedom of rotation about the leg axis by allowing for longer flexure strips. For a given flexibility about the leg axis, the preferred embodiment shown in FIGS. 9A–9C may be lighter and more compact than the embodiment shown in FIG. 8A, where the joint elements are both concentric and coaxial. Also, for some applications it may be desirable to have both first attachment members 230 and second attachment members 260 (see FIG. 2A) with three degrees of freedom of motion and the configuration of the flexural joint shown in FIGS. 9A–9C.

Figure 10A:
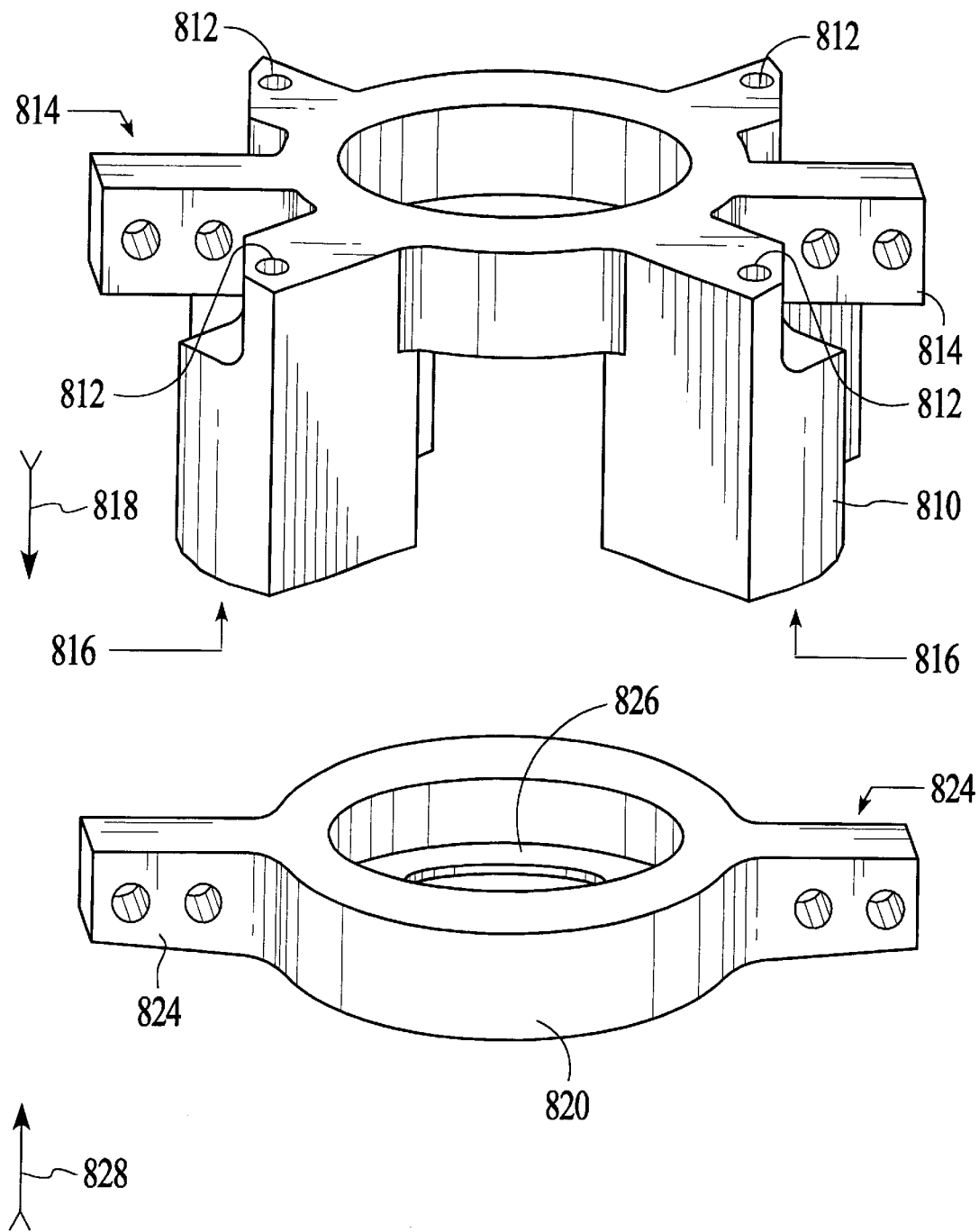
FIG. 10A shows an exploded perspective of an embodiment of a two degrees of freedom of movement flexural joint.
Figure 10B:
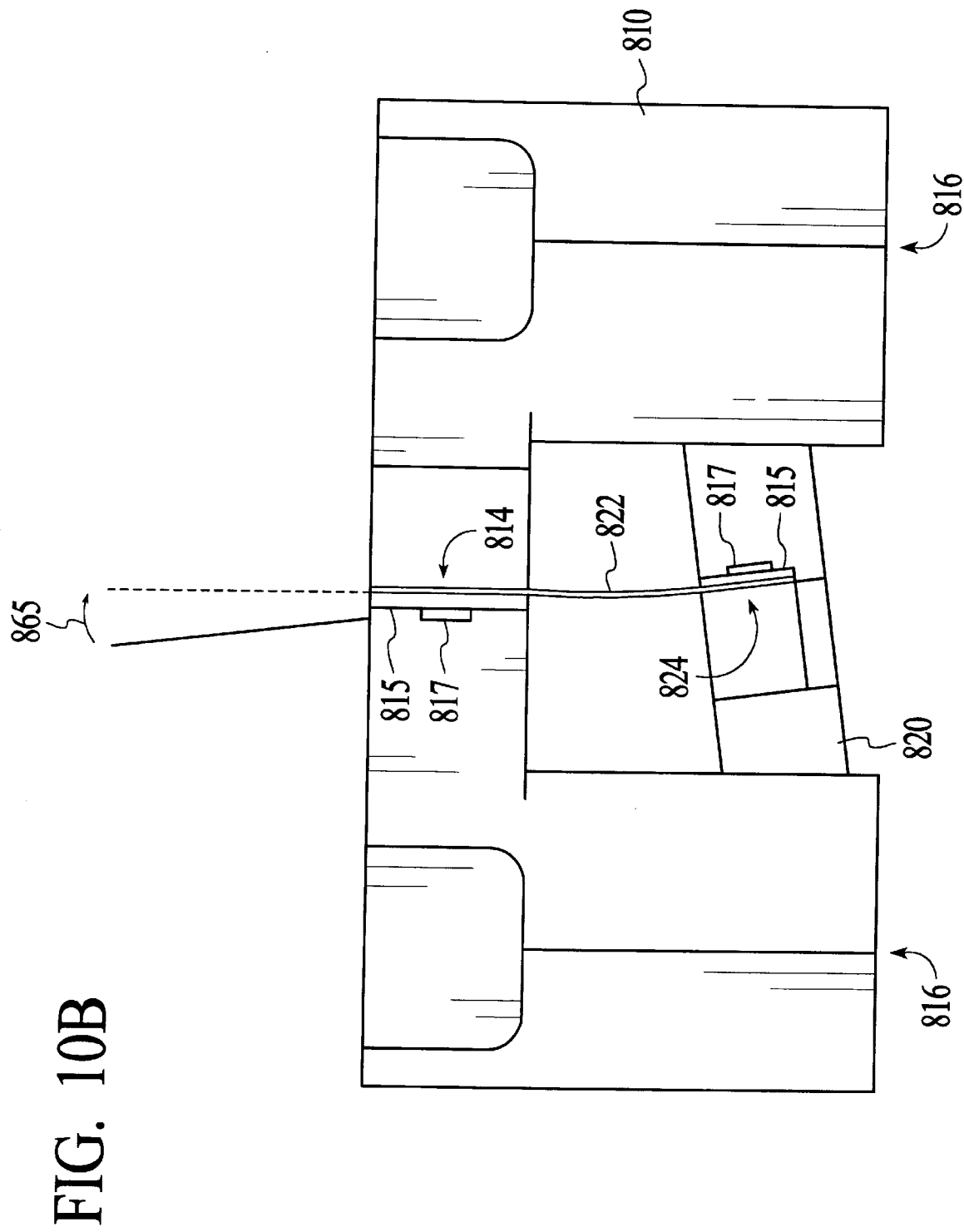
FIG. 10B shows an embodiment of a two degrees of freedom of movement flexural joint with tilt of the leg axis.
Figure 10C:
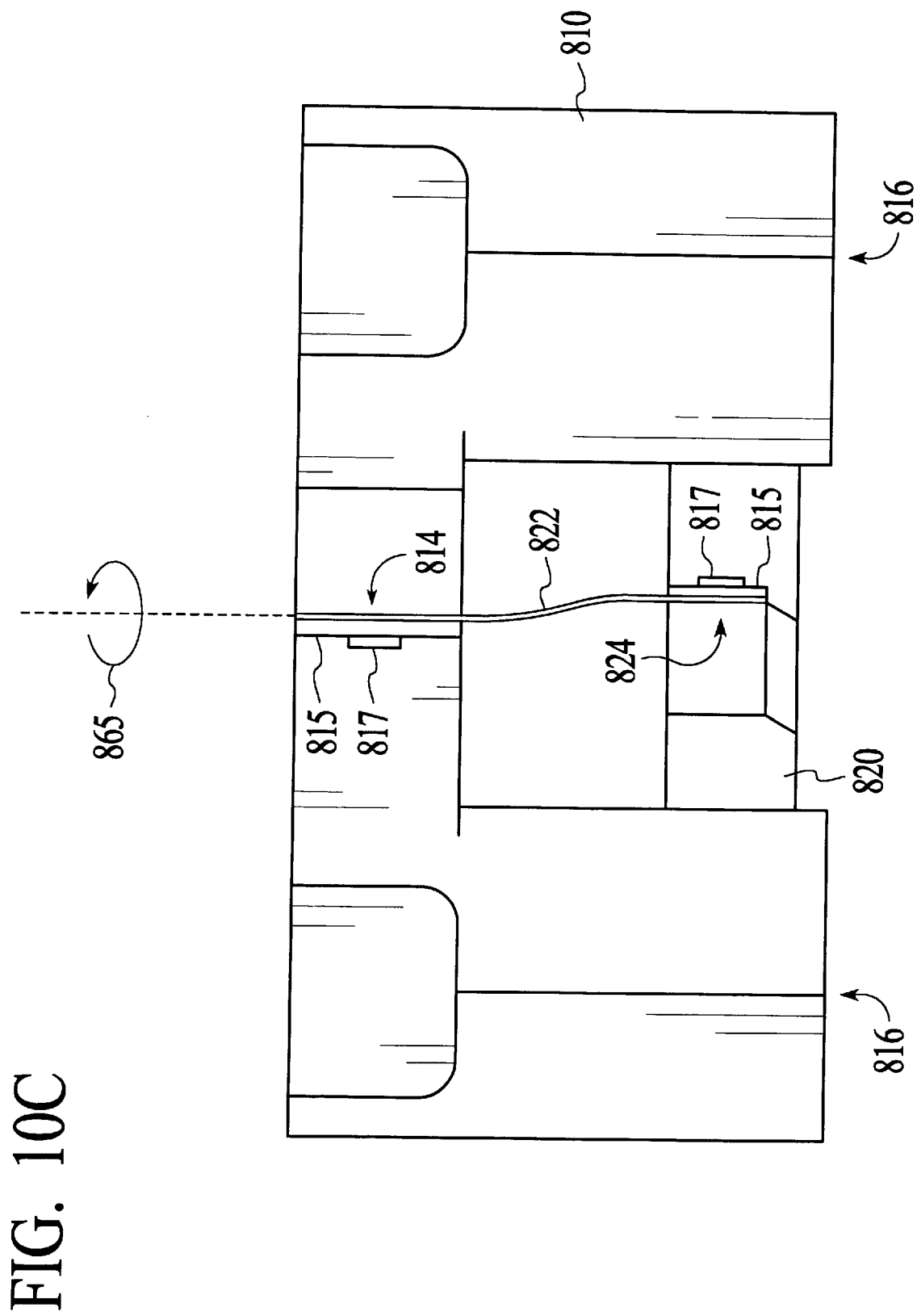
FIG. 10C shows an embodiment of a two degrees of freedom of movement flexural joint with rotation about the leg axis.

The general design concept used for the three degrees of freedom of motion joint shown in FIGS. 9A–9C can be simplified to give a two degrees of freedom of motion joint; this two degrees of freedom of motion joint is shown in FIGS. 10A–10C. This joint can be used where only two degrees of freedom of motion are required.

FIG. 10A shows an exploded perspective view of an embodiment of the two degrees of freedom of movement flexural joint. In FIG. 10A, first joint element 810, fastener clearance holes 812, first flexure strip attachment surfaces 814, first load bearing surface 816, first direction 818, second joint element 820, second flexure attachment surfaces 824, second load bearing surface 826 and second direction 828, are shown. All flexure strips are secured on flexure strip attachment surfaces 814 and 824. (Flexure strips and fastening means are omitted from FIG. 10A for the sake of clarity.) The first load bearing surface 816 is the bottom surface of first joint element 810. The first direction 818 is the direction normal to the first load bearing surface. The second load bearing surface 826 is the recessed surface of second joint element 820. The second direction 828 is the direction normal to the second load bearing surface. The second direction is opposite to the first direction.

FIG. 10B shows an embodiment of the two degrees of freedom of movement flexural joint with tilt of the leg axis. In FIG. 10B, first joint element 810, second joint element 820, first flexure strip attachment surface 814, caps 815, fasteners 817, first flexure strips 822, second flexure strip attachment surface 824 and axis 865 are shown.

In FIG. 10B, the joint elements are connected as described above for FIG. 10A. In addition, first flexure strips 822 are fastened on second flexure strip attachment surfaces 824 and first flexure strip attachment surfaces 814 by caps 815 and fasteners 817. Note that the first and second joint elements are connected by two first flexure strips, diametrically opposed (see FIG. 10A); only one of the first flexure strips can be seen in FIG. 10B.

FIG. 10B illustrates a degree of freedom of movement of the joint. As first flexure strips 822 bend, second joint element 820 tilts. Note that this motion results in movement of axis 865 as shown. (Note that due to the nature of flexure strip distortion under load, there may be some displacement of one joint element with respect to the next in addition to the tilt described above.)

FIG. 10C shows an embodiment of the two degrees of freedom of movement flexural joint with rotation about the axis 865. In FIG. 10C, first joint element 810, second joint element 820, fastener clearance holes 812, first flexure strip attachment surfaces 814, caps 815, fasteners 817, second flexure attachment surfaces 824, first flexure strips 822 and axis 865 are shown. Elements shown in FIG. 10C are as in FIG. 10B.

FIG. 10C illustrates a second degree of freedom of movement of the joint. As first flexure strips 822 bend and twist, for example as a reaction to a torque about axis 865, there is rotational motion of second joint element 820 about axis 865. (Note that due to the nature of flexure strip distortion under load, there may be some displacement of one joint element with respect to the next in addition to the rotation described above.) Note that the first and second joint elements are connected by two first flexure strips, diametrically opposed (see FIG. 10A); only one of the first flexure strips can be seen in FIG. 10C.

Thus, as illustrated in FIG. 10B and FIG. 10C, the joint has two degrees of freedom of movement. It is noteworthy in the above that stiffness of the joint may be changed by altering the length or material properties of the flexure strips.

FIG. 2B shows a charged particle beam lithography system which is comprised of an embodiment of the present invention coupled with a vacuum system (vacuum-sealed frame 210 and vacuum pump 215) and a charged particle beam generator (charged particle optics 295). The charged particles could be electrons in a preferred embodiment or ions in other embodiments.

In FIG. 2B, the vacuum system maintains a gas density within the vacuum-sealed frame that allows a charged particle beam to propagate without significant charged particle scattering. The charged particle beam lithography system generates and controls at least one charged particle beam for writing patterns on a semiconductor wafer as well as controlling the position of the at least one charged particle beam relative to the wafer. An aspect of positioning of the at least one charged particle beam relative to the wafer includes articulating elements of stage 200 according to this invention. Note that the stage of this invention is particularly well suited to a multiple column, multiple electron beam lithography system (each column having multiple electron beams), where columns are distributed over the area of the wafer, allowing lithography with only minimal movement of the stage.

The top surface of the platform should be capable of accommodating a semiconductor wafer with a diameter of at least 100 mm, and preferably a diameter of 300 mm.

In a preferred embodiment, a low-mass high precision stage capable of holding a 300 mm wafer weighs less than 100 lbs. This is achieved by optimizing the engineering design and using lightweight materials; the use of alumina-based ceramic for the platform 240 and legs 270 and relieving the backside of the reflective top (386) and side surfaces (385) of the platform are described above.

Preferred embodiments of the stage as described above are operated with the wafer at 50 kV relative to the frame, and could be operated at 120 kV or higher.

The foregoing descriptions of various embodiments of the invention have been presented for purposes of illustration and description. It is not intended to limit the invention to the precise forms disclosed. Many modifications and equivalent arrangements will be apparent.

What is claimed is:

1. A stage comprising:

a base;

a frame attached to said base;

a platform with a bottom platform surface;

at least three adjustable limbs coupled to said base and said bottom platform surface, each limb comprising a raising member attached to said base, a first attachment member attached to said raising member, a leg, a bottom end of said leg attached to said first attachment member, a second attachment member attached to a top end of said leg and said second attachment member attached to said bottom platform surface; and platform movement members coupled to said platform and said frame.

2. The stage of claim 1, wherein each of said first attachment members have two degrees of freedom of movement.

3. The stage of claim 1, wherein each of said first attachment members have three degrees of freedom of movement.

4. The stage of claim 1, wherein each of said second attachment members have three degrees of freedom of movement.

5. The stage of claim 2, wherein each of said second attachment members have three degrees of freedom of movement.

6. The stage of claim 1, wherein each of said second attachment members have two degrees of freedom of movement.

7. The stage of claim 3, wherein each of said second attachment members have two degrees of freedom of movement.

8. The stage of claim 1, wherein said first attachment members are flexural joints.

9. The stage of claim 1, wherein said first attachment members are flexural thrust joints.

10. The stage of claim 1, wherein said second attachment members are flexural joints.

11. The stage of claim 1, wherein said second attachment members are flexural thrust joints.

12. The stage of claim 8, wherein said second attachment members are flexural joints.

13. The stage of claim 9, wherein said second attachment members are flexural thrust joints.

14. The stage of claim 1, wherein said platform movement members comprise at least three platform actuators.

15. The stage of claim 14, wherein at least one of said platform actuators is an electromagnetic platform actuator.

16. The stage of claim 15, wherein said electromagnetic platform actuator comprises:

a first coil attached to said platform;

a first magnet assembly attached to said frame and electromagnetically coupled to said first coil; and a current control system electrically coupled to said first coil.

17. The stage of claim 16, further comprising a cooling system and cooling channels thermally coupled to said coil.

18. The stage of claim 17, wherein said cooling system and cooling channels maintain a platform reference temperature to within +/−0.1 degrees Celsius.

19. The stage of claim 1, wherein said raising members are support elements, providing a force to oppose the weight of said platform.

20. The stage of claim 19, wherein said support elements are constant force supports.

21. The stage of claim 20, wherein said constant force supports are buckled columns.

22. The stage of claim 1, wherein said raising members are raising actuators, allowing adjustment of the elevation of said platform relative to said base.

23. The stage of claim 22, wherein at least one of said raising actuators is an electromagnetic raising actuator.

24. The stage of claim 23, wherein said electromagnetic raising actuator comprises:

a second coil attached to said base;

a second magnet assembly attached to one of said first attachment members and electromagnetically coupled to said second coil; and a current controller electrically coupled to said second coil.

25. The stage of claim 1, wherein said raising members are damping elements.

26. The stage of claim 1, wherein each raising member is a support element in parallel with a raising actuator.

27. The stage of claim 1, wherein each raising member is a support element in parallel with a damping element.

28. The stage of claim 1, wherein each raising member is a damping element in parallel with a raising actuator.

29. The stage of claim 1, wherein each raising member is a support element, a damping element and a raising actuator, all in parallel.

30. The stage of claim 1, wherein said legs are substantially parallel to each other.

31. The stage of claim 1, wherein said platform is substantially electrically insulating.

32. The stage of claim 1, wherein said legs are substantially electrically insulating.

33. The stage of claim 1, wherein said frame is a vacuum chamber.

34. The stage of claim 1, wherein said platform has a top surface capable of accommodating a wafer with a diameter of at least 100 mm.

35. The stage of claim 1, wherein said platform has a top surface capable of accommodating a wafer with a diameter of 300 mm.

36. The stage of claim 35, wherein the weight of said stage is less than 100 lbs.

37. A stage comprising:

a base;

a frame attached to said base;

a platform with a bottom platform surface;

three substantially parallel adjustable limbs coupled to said base and said bottom platform surface, each limb comprising a raising member attached to said base, where said raising member is a constant force support in parallel with an electromagnetic raising actuator, a first flexural thrust joint with three degrees of freedom of movement attached to said raising member, a leg, a bottom end of said leg attached to said first flexural thrust joint, a second flexural thrust joint with two degrees of freedom of movement attached to a top end of said leg and said second flexural thrust joint attached to said bottom platform surface; and four electromagnetic platform actuators coupled to said platform and said frame, whereby coordinated operation of both raising actuators and platform actuators provides precise positioning and movement of said platform with six degrees of freedom.

* * * * *